United States Patent
Gholmieh et al.

(10) Patent No.: US 10,536,955 B2
(45) Date of Patent: Jan. 14, 2020

(54) CAPABILITY COORDINATION ACROSS RADIO ACCESS TECHNOLOGIES

(71) Applicant: QUALCOMM Incorporated, San Diego, CA (US)

(72) Inventors: Aziz Gholmieh, Del Mar, CA (US); Gavin Bernard Horn, La Jolla, CA (US); Keiichi Kubota, San Diego, CA (US); Masato Kitazoe, Hachiouji (JP); Srinivasan Balasubramanian, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 100 days.

(21) Appl. No.: 15/673,579

(22) Filed: Aug. 10, 2017

(65) Prior Publication Data
US 2018/0049213 A1    Feb. 15, 2018

Related U.S. Application Data

(60) Provisional application No. 62/418,083, filed on Nov. 4, 2016, provisional application No. 62/374,745, filed on Aug. 12, 2016.

(51) Int. Cl.
*H04B 7/216*    (2006.01)
*H04W 72/12*    (2009.01)
(Continued)

(52) U.S. Cl.
CPC .......... *H04W 72/1215* (2013.01); *H03D 7/16* (2013.01); *H04L 41/0226* (2013.01);
(Continued)

(58) Field of Classification Search
CPC ......... H04W 72/1215; H04W 72/0486; H04W 8/24; H04W 88/023
See application file for complete search history.

(56) References Cited

U.S. PATENT DOCUMENTS 10,070,378 B2 * 9/2018 Fornoles, Jr. ......... H04W 48/20
2011/0122801 A1 * 5/2011 Franklin ............... H04W 8/245
370/280
(Continued)

FOREIGN PATENT DOCUMENTS

WO    WO-2013169061 A1    11/2013
WO    WO-2014176106 A1    10/2014

OTHER PUBLICATIONS

Intel Corporation: "RRC Aspects for LTE-NR Interworking", 3GPP Draft; R2-163587, 3rd Generation Partnership Project (3GPP), Mobile Competence Centre, 650, Route Des Lucioles, F-06921 Sophia-Antipolis Cedex, France, vol. RAN WG2, No. Nanjing, China; May 22, 2016, XP051105036, Retrieved from the Internet: URL:http://www.3gpp.org/ftp/Meetings_3GPP_SYNC/RAN2/ Docs/ [retrieved on May 22, 2016], 5 pages.
(Continued)

*Primary Examiner* — Bo Hui A Zhu
(74) *Attorney, Agent, or Firm* — Patterson & Sheridan, LLP

(57) ABSTRACT

Certain aspects of the present disclosure relate to methods and apparatus for coordinating UE capabilities across RATs. In some cases, a UE may provide an indication of one or more first sets of capabilities of the UE to operate in a first RAT network that are compatible with one or more second sets of capabilities of the UE to operate in a second RAT network. Indicating the sets of capabilities may require less signaling overhead than explicitly signaling all possible combinations of capabililites.

28 Claims, 19 Drawing Sheets

(51) Int. Cl.
*H03D 7/16* (2006.01)
*H04L 12/24* (2006.01)
*H04W 16/10* (2009.01)
*H04W 28/02* (2009.01)
*H04W 72/04* (2009.01)

(52) U.S. Cl.
CPC .......... *H04L 41/082* (2013.01); *H04W 16/10* (2013.01); *H04W 28/0263* (2013.01); *H04W 72/0486* (2013.01)

(56) References Cited

U.S. PATENT DOCUMENTS

2015/0208311 A1* 7/2015 Lee .................. H04W 24/10 455/436
2017/0374607 A1* 12/2017 Wu .................. H04W 28/18

OTHER PUBLICATIONS

International Search Report and Written Opinion—PCT/US2017/046418—ISA/EPO—dated Nov. 16, 2017.

ITRI: "UE Capabilities Issues for Tight Interworking between NR and LTE", 3GPP Draft; R2-163791, 3rd Generation Partnership Project (3GPP), Mobile Competence Centre, 650, Route Des Lucioles, F-06921 Sophia-Antipolis Cedex, France, vol. RAN WG2, No. Nanjing, China; May 22, 2016, XP051105198, Retrieved from the Internet: URL:http://www.3gpp.org/ftp/Meetings_3GPP_SYNC/RAN2/Docs/ [retrieved on May 22, 2016], 3 pages.

Qualcomm Incorporated: "Capability Coordination across RATs", 3GPP Draft; R2-165644, 3rd Generation Partnership Project (3GPP), Mobile Competence Centre, 650, Route Des Lucioles, F-06921 Sophia-Antipolis Cedex, France, vol. RAN WG2. no. Gothenburg; Aug. 13, 2016, XP051134281, Retrieved from the Internet: URL:http://www.3gpp.org/ftp/tsg_ran/WG2_RL2/TSGR2_95/Docs/ [retrieved on Aug. 13, 2016], 6 pages.

Qualcomm Incorporated: "LTE/NR Capabilites Dependencies" 3GPP Draft; R2-1704129, 3rd Generation Partnership Project (3GPP), Mobile Competence Centre, 650, Route Des Lucioles, F-06921 Sophia-Antipolis Cedex, France, vol. RAN WG2, No. Spokane, USA; May 14, 2017, XP051274736, Retrieved from the Internet: URL:http://www.3gpp.org/ftp/Meetings_3GPP_SYNC/RAN2/Docs/ [retrieved on May 14, 2017], 6 pages.

* cited by examiner

| Groups | Band-1-F | Class DL | Class UL | Band-2-F | Class DL | Class UL | Band-3-F | Class DL | Class UL | Band-4-F | Class DL | Class UL |
|---|---|---|---|---|---|---|---|---|---|---|---|---|
| 1 | L1 | a | a | | | | | | | | | |
| 1 | L1 | b | a | | | | | | | | | |
| 1 | L1 | a | a | M1 | a | | | | | | | |
| 1 | L1 | a | a | M1 | a | | | | | | | |
| 1 | L1 | a | | M1 | a | a | | | | | | |
| 1 | L1 | a | a | M1 | a | a | | | | | | |
| 1 | L1 | a | | M1 | a | a | | | | | | |
| 1 | L1 | a | a | M2 | a | | | | | | | |
| 1 | L1 | a | | M2 | a | a | | | | | | |
| 1 | L1 | a | a | M3 | a | | | | | | | |
| 1 | L1 | a | | M3 | a | a | | | | | | |
| 1 | L1 | a | a | M3 | a | a | | | | | | |
| 2 | L1 | a | a | M1 | a | | M2 | a | | | | |
| 2 | L1 | a | | M1 | a | | M2 | a | a | | | |
| 2 | L1 | a | | M1 | a | a | M2 | a | a | | | |
| 2 | L1 | a | | M1 | a | a | M2 | a | | | | |
| 2 | L1 | a | a | M2 | a | | M2 | a | | | | |
| 2 | L1 | a | | M2 | a | a | M2 | a | | | | |
| 2 | L1 | a | a | M2 | c | | | | | | | |
| 2 | L1 | a | | M2 | c | a | | | | | | |
| 3 | M1 | a | a | | | | | | | | | |
| 3 | M1 | a | a | | | | | | | | | |
| 3 | M1 | a | a | M1 | a | | | | | | | |
| 3 | M1 | a | a | M1 | a | | | | | | | |
| 3 | M1 | a | a | M1 | a | a | | | | | | |
| 3 | M1 | a | a | M2 | a | | | | | | | |
| 3 | M1 | a | | M2 | a | a | | | | | | |
| 3 | M1 | a | a | M2 | a | a | | | | | | |
| 3 | M1 | a | a | M3 | a | | | | | | | |
| 3 | M1 | a | | M3 | a | a | | | | | | |
| 3 | M1 | a | a | M3 | a | a | | | | | | |
| 3 | M1 | c | a | | | | | | | | | |
| 3 | M1 | c | a | | | | | | | | | |
| 3 | M2 | a | a | | | | | | | | | |
| 3 | M2 | a | a | M2 | a | | | | | | | |
| 3 | M2 | c | a | | | | | | | | | |
| 3 | M3 | a | a | | | | | | | | | |
| 3 | M3 | c | a | | | | | | | | | |

FIG. 15A

| Groups | Band-1-F Class DL | Class UL | Band-2-F | Class DL | Class UL | Band-3-F Class DL | Class UL | Band-4-F | Class DL | Class UL |
|---|---|---|---|---|---|---|---|---|---|---|
| 4 | M1 | a | a | M1 | a |  | M2 | a |  |  |  |
| 4 | M1 | a |  | M1 | a |  | M2 | a | a |  |  |
| 4 | M1 | a | a | M2 | a |  | M2 | a |  |  |  |
| 4 | M1 | a |  | M2 | a | a | M2 | a |  |  |  |
| 5 | M1 | a | a | M1 | a |  | M2 | a |  | M2 | a |
| 5 | M1 | a |  | M1 | a |  | M2 | a | a | M2 | a |
| 6 | H1 | a | a |  |  |  |  |  |  |  |  |
| 6 | H1 | b | a |  |  |  |  |  |  |  |  |
| 6 | H1 | a | a | L1 | a |  |  |  |  |  |  |
| 6 | H1 | a |  | L1 | a | a |  |  |  |  |  |
| 6 | H1 | a | a | L1 | a | a |  |  |  |  |  |
| 6 | H1 | a | a | M1 | a |  |  |  |  |  |  |
| 6 | H1 | a | a | M1 | a |  |  |  |  |  |  |
| 6 | H1 | a |  | M1 | a | a |  |  |  |  |  |
| 6 | H1 | a | a | M1 | a | a |  |  |  |  |  |
| 6 | H1 | a |  | M1 | a | a |  |  |  |  |  |
| 6 | H1 | a | a | M1 | a | a |  |  |  |  |  |
| 6 | H1 | a | a | M2 | a |  |  |  |  |  |  |
| 6 | H1 | a |  | M2 | a | a |  |  |  |  |  |
| 6 | H1 | a | a | M3 | a |  |  |  |  |  |  |
| 6 | H1 | a |  | M3 | a | a |  |  |  |  |  |
| 6 | H1 | a | a | M3 | a | a |  |  |  |  |  |
| 6 | H1 | a | a | H1 | a |  |  |  |  |  |  |
| 6 | H1 | c | a |  |  |  |  |  |  |  |  |
| 6 | H1 | c | c |  |  |  |  |  |  |  |  |
| 7 | H1 | a | a | L1 | a |  | M1 | a | a |  |  |
| 7 | H1 | a | a | L1 | a |  | M1 | a |  |  |  |
| 7 | H1 | a |  | L1 | a |  | M1 | a | a |  |  |
| 7 | H1 | a | a | L1 | a | a | M1 | a |  |  |  |
| 7 | H1 | a |  | L1 | a | a | M1 | a | a |  |  |
| 7 | H1 | a |  | L1 | a | a | M1 | a |  |  |  |
| 7 | H1 | a | a | M1 | a |  | M1 | a |  |  |  |
| 7 | H1 | a |  | M1 | a | a | M1 | a |  |  |  |
| 7 | H1 | a | a | M1 | a |  | M2 | a |  |  |  |
| 7 | H1 | a |  | M1 | a |  | M2 | a | a |  |  |
| 7 | H1 | a |  | M1 | a | a | M2 | a |  |  |  |

FIG. 15B

| Groups | Band-1-F | Class DL | Class UL | Band-2-F | Class DL | Class UL | Band-3-F | Class DL | Class UL | Band-4-F | Class DL | Class UL |
|---|---|---|---|---|---|---|---|---|---|---|---|---|
| 7 | H1 | b | a | M1 | a |   | M3 | a |   |   |   |   |
| 7 | H1 | b |   | M1 | a |   | M3 | a | a |   |   |   |
| 7 | H1 | a | a | M1 | a |   | M3 | a | a |   |   |   |
| 7 | H1 | a | a | M1 | a |   | M3 | a |   |   |   |   |
| 7 | H1 | b |   | M1 | a | a | M3 | a |   |   |   |   |
| 7 | H1 | a | a | M1 | a | a | M3 | a |   |   |   |   |
| 7 | H1 | a |   | M1 | a | a | M3 | a |   |   |   |   |
| 7 | H1 | a | a | H1 | a |   | M1 | a |   |   |   |   |
| 7 | H1 | a |   | H1 | a |   | M1 | a | a |   |   |   |
| 8 | H1 | a | a | L1 | a |   | M1 | a |   | M3 | a | a |
| 8 | H1 | a | a | L1 | a |   | M1 | a |   | M3 | a |   |
| 8 | H1 | a |   | L1 | a |   | M1 | a | a | M3 | a |   |
| 8 | H1 | a |   | L1 | a |   | M1 | a |   | M3 | a | a |
| 8 | H1 | a | a | L1 | a | a | M1 | a |   | M3 | a |   |
| 8 | H1 | a |   | L1 | a | a | M1 | a |   | M3 | a | a |
| 8 | H1 | a |   | L1 | a | a | M1 | a |   | M3 | a |   |
| 8 | H1 | c | a | M1 | a |   | M3 | a |   |   |   |   |
| 8 | H1 | c |   | M1 | a |   | M3 | a | a |   |   |   |
| 8 | H1 | a | a | M1 | c |   | M3 | a |   |   |   |   |
| 8 | H1 | a |   | M1 | c |   | M3 | a | a |   |   |   |
| 8 | H1 | c |   | M1 | a | a | M3 | a |   |   |   |   |
| 8 | H1 | a |   | M1 | c | a | M3 | a |   |   |   |   |
| 8 | H1 | a | a | H1 | a |   | M1 | a |   | M1 | a |   |
| 8 | H1 | a |   | H1 | a |   | M1 | a | a | M1 | a |   |
| 9 | H2 | a |   | L1 | a | a |   |   |   |   |   |   |
| 9 | H2 | a |   | M1 | a | a |   |   |   |   |   |   |
| 9 | H2 | a |   | M1 | a | a |   |   |   |   |   |   |
| 9 | H2 | a |   | M2 | a | a |   |   |   |   |   |   |
| 9 | H2 | a |   | M3 | a | a |   |   |   |   |   |   |
| 9 | H2 | a |   | H1 | a | a |   |   |   |   |   |   |
| 10 | H2 | c |   | M1 | a | a |   |   |   |   |   |   |
| 10 | H2 | c |   | M2 | a | a |   |   |   |   |   |   |
| 10 | H2 | a |   | H2 | a |   | M1 | a | a |   |   |   |
| 10 | H2 | a |   | H2 | a |   | M2 | a | a |   |   |   |
| 11 | H2 | d |   | M1 | a | a |   |   |   |   |   |   |
| 11 | H2 | d |   | M2 | a | a |   |   |   |   |   |   |
| 11 | H2 | c |   | H2 | a |   | M1 | a | a |   |   |   |
| 11 | H2 | c |   | H2 | a |   | M2 | a | a |   |   |   |

FIG. 15C

|  | LTE / NR | Medium Bands | | High Bands | | mmwave | |
|---|---|---|---|---|---|---|---|
|  |  | 1 | 3 | 4 | 6 | 7 | 8 |
| Low Bands | 1 | X | X | X | X | X | X |
|  | 2 | X |  | X |  | X |  |
| Mid Bands | 3 |  |  | X | X | X | X |
|  | 4 |  |  | X |  | X |  |
| High Bands | 5 | X | X |  |  | X | X |
|  | 6 | X |  |  |  | X |  |

FIG. 16

|  |  |  | Medium Bands | | | High Bands | | | mmwave | |
|---|---|---|---|---|---|---|---|---|---|---|
|  |  |  | L | M | H | L | M | H | H | HH |
|  | LTE / NR | 0 | 1 | 2 | 3 | 4 | 5 | 6 | 7 | 8 |
|  | 0 |  |  |  |  |  |  |  |  |  |
| Low Bands | 1 |  | X | X | X | X | X | X | X | X |
|  | 2 |  |  | X |  |  | X |  |  | X |
| Mid Bands | 3 |  |  |  |  | X | X | X | X | X |
|  | 4 |  |  |  |  | X |  |  |  | X |
| High Bands | 5 |  | X | X | X |  |  |  | X | X |
|  | 6 |  | X |  |  |  |  |  | X |  |

FIG. 17

CAPABILITY COORDINATION ACROSS RADIO ACCESS TECHNOLOGIES

PRIORITY CLAIM

The present Application for Patent claims benefit of and priority to U.S. Provisional Patent Application Ser. No. 62/374,745 filed Aug. 12, 2016, and U.S. Provisional Patent Application Ser. No. 62/418,083, filed Nov. 4, 2016. Both of these applications are assigned to the assignee hereof, Qualcomm Incorporated, and hereby expressly incorporated by reference herein as if fully set forth below and for all applicable purposes.

TECHNICAL FIELD

The present disclosure relates generally to wireless communication, and more particularly, to methods and apparatus for providing capability coordination across radio access technologies (RATs) Embodiments and aspects of the technology can enable and provide efficient decision making (e.g., regarding inter-RAT mobility or aggregation) by avoiding the need to signal large amounts of capability information.

INTRODUCTION

Wireless communication systems are widely deployed to provide various telecommunication services such as telephony, video, data, messaging, and broadcasts. Typical wireless communication systems may employ multiple-access technologies capable of supporting communication with multiple users by sharing available system resources (e.g., bandwidth, transmit power). Examples of such multiple-access technologies include, Long Term Evolution (LTE) systems, code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, and time division synchronous code division multiple access (TD-SCDMA) systems.

A wireless communication network may include a number of Node Bs that can support communication for a number of user equipments (UEs). A UE may communicate with a Node B via the downlink and uplink. The downlink (or forward link) refers to the communication link from the Node B to the UE, and the uplink (or reverse link) refers to the communication link from the UE to the Node B.

These multiple access technologies have been adopted in various telecommunication standards to provide a common protocol that enables different wireless devices to communicate on a municipal, national, regional, and even global level. An example of an emerging telecommunication standard is new radio (NR, e.g., 5G radio access). NR is a set of enhancements to the LTE mobile standard promulgated by Third Generation Partnership Project (3GPP). It is designed to better support mobile broadband Internet access by improving spectral efficiency, lower costs, improve services, make use of new spectrum, and better integrate with other open standards using OFDMA with a cyclic prefix (CP) on the downlink (DL) and on the uplink (UL) as well as support beamforming, multiple-input multiple-output (MIMO) antenna technology, and carrier aggregation. However, as the demand for mobile broadband access continues to increase, there exists a need for further improvements in NR technology. Preferably, these improvements should be applicable to other multi-access technologies and the telecommunication standards that employ these technologies.

BRIEF SUMMARY OF SOME EXAMPLES

The following summarizes some aspects of the present disclosure to provide a basic understanding of the discussed technology. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in summary form as a prelude to the more detailed description that is presented later.

Cellular networks generally strive to consider capabilities of a user equipment (UE), for example, when making mobility decisions or configuring the UE to work in a particular radio access technology (RAT). In some cases, a RAT may have different capabilities in different RATs, which may complicate decisions when making inter-RAT mobility and data aggregation decisions. The substantial size of the amount of capability information that might be provided to make such decisions may impact performance. In some cases, the size may even make it difficult to convey the information (e.g., in a connection procedure). Accordingly, embodiments and techniques described below may help enable decision making for a multi-RAT UE, while minimizing (or at least reducing).

Certain aspects of the present disclosure provide a method for wireless communications by a User Equipment (UE). The method generally includes obtaining first information about a first radio access technology (RAT) network and second information about a second RAT network, determining, based on the first and second information, one or more first sets of capabilities of the UE in the first RAT network that are compatible with one or more second sets of capabilities of the UE in the second RAT, providing an indication of one or more first sets of capabilities to the first RAT network, providing an indication of one or more second sets of capabilities to the second RAT network, and receiving signaling configuring the UE to operate in the first RAT network in accordance with one of the first sets of capabilities and to operate in the second RAT network in accordance with one of the second sets of capabilities.

Certain aspects of the present disclosure provide a method for wireless communications by a Base Station (BS). The method generally includes obtaining information regarding one or more first sets of capabilities of a user equipment (UE) in the first RAT network that are compatible with one or more second sets of capabilities of the UE in one or more second RATs and configuring the UE to operate in the first RAT network in accordance with one of the first sets of capabilities.

Aspects generally include methods, apparatus, systems, computer program products, computer-readable medium, and processing systems, as substantially described herein with reference to and as illustrated by the accompanying drawings.

Other aspects, features, and embodiments of the present invention will become apparent to those of ordinary skill in the art, upon reviewing the following description of specific, exemplary embodiments of the present invention in conjunction with the accompanying figures. While features of the present invention may be discussed relative to certain embodiments and figures below, all embodiments of the present invention can include one or more of the advantageous features discussed herein. In other words, while one or more embodiments may be discussed as having certain advantageous features, one or more of such features may also be used in accordance with the various embodiments of the invention discussed herein. In similar fashion, while exemplary embodiments may be discussed below as device, system, or method embodiments it should be understood that such exemplary embodiments can be implemented in various devices, systems, and methods.

BRIEF DESCRIPTION OF THE DRAWINGS

FIGS. 15A-15C illustrate an example of inter-RAT band combination groups, in accordance with aspects of the present disclosure.

FIG. 16 illustrates an example of inter-RAT dependency matrix, in accordance with aspects of the present disclosure.

FIG. 17 illustrates another example of inter-RAT dependency matrix, in accordance with aspects of the present disclosure.

DETAILED DESCRIPTION

Figure 1:
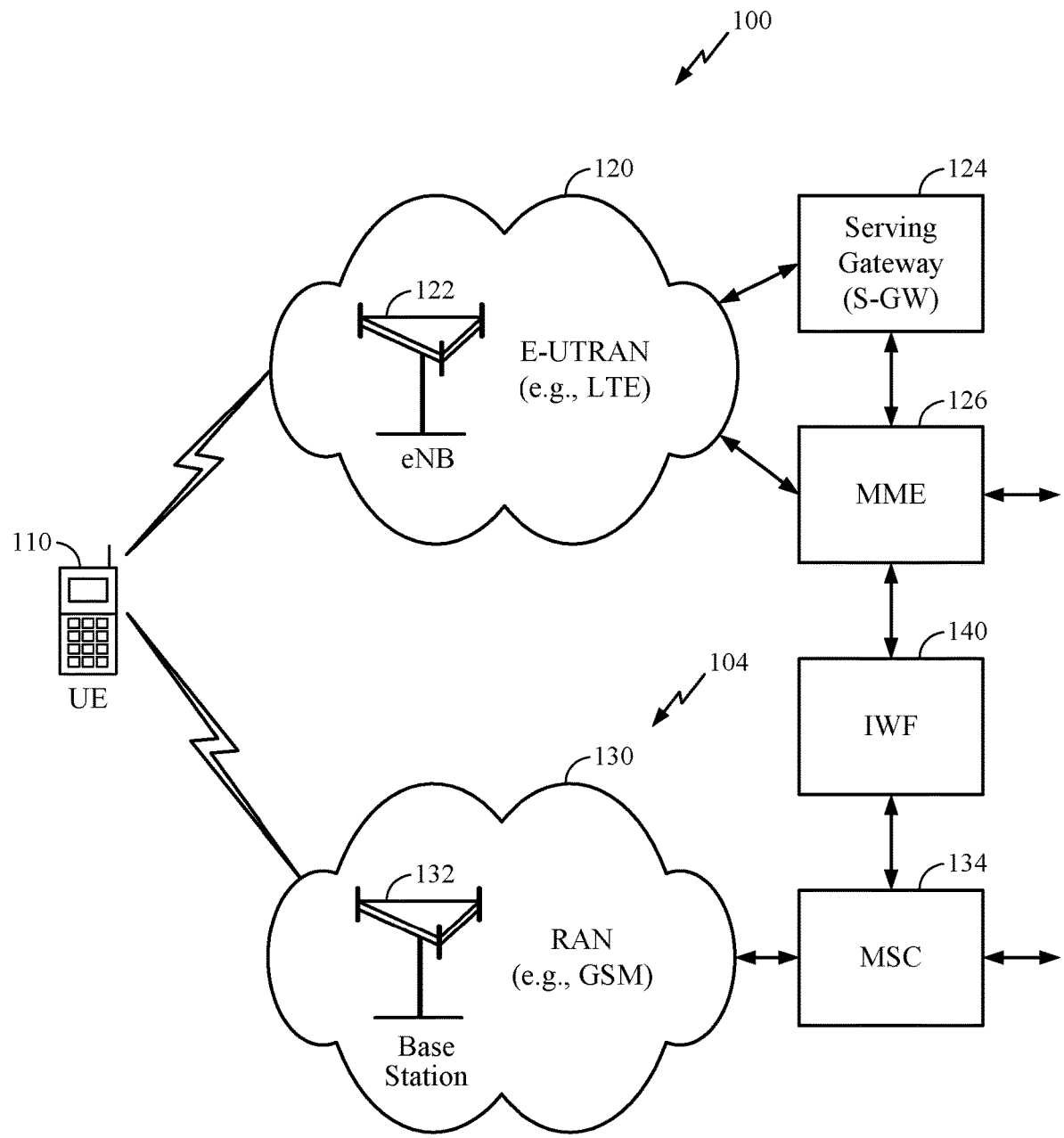
FIG. 1 is a diagram illustrating an example of a network architecture according to some embodiments.

Aspects of the present disclosure provide techniques for coordinating wireless node (e.g., UE) capability across different RATs (e.g., LTE, 5G, and/or WLAN). In certain scenarios, rather than provide UE capability information for different RATs with fine granularity, which might require a substantial amount of signaling overhead due to the amount of information, a division of capabilities between different RATs may be provided. Such information, for example, may be sufficient to allow for at least RF compatibility and basedband combinations, while keeping the signaling to a minimum.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts.

Several aspects of telecommunication systems will now be presented with reference to various apparatus and methods. These apparatus and methods will be described in the following detailed description and illustrated in the accompanying drawings by various blocks, modules, components, circuits, steps, processes, algorithms, etc. (collectively referred to as "elements"). These elements may be implemented using hardware, software, or combinations thereof. Whether such elements are implemented as hardware or software depends upon the particular application and design constraints imposed on the overall system.

By way of example, an element, or any portion of an element, or any combination of elements may be implemented with a "processing system" that includes one or more processors. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software modules, applications, software applications, software packages, firmware, routines, subroutines, objects, executables, threads of execution, procedures, functions, etc., whether referred to as software, firmware, middleware, microcode, hardware description language, or otherwise.

Accordingly, in one or more exemplary embodiments, the functions described may be implemented in hardware, software, or combinations thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise RAM, ROM, EEPROM, PCM (phase change memory), flash memory, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art.

Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim. The word "exemplary" is used herein to mean "serving as an example, instance, or illustration." Any aspect described herein as "exemplary" is not necessarily to be construed as preferred or advantageous over other aspects.

Although particular aspects are described herein, many variations and permutations of these aspects fall within the scope of the disclosure. Although some benefits and advantages of the preferred aspects are mentioned, the scope of the disclosure is not intended to be limited to particular benefits, uses, or objectives. Rather, aspects of the disclosure are intended to be broadly applicable to different wireless technologies, system configurations, networks, and transmission protocols, some of which are illustrated by way of example in the figures and in the following description of the preferred aspects. The detailed description and drawings are merely illustrative of the disclosure rather than limiting, the scope of the disclosure being defined by the appended claims and equivalents thereof.

The techniques described herein may be used for various wireless communication networks such as Code Division Multiple Access (CDMA) networks, Time Division Multiple Access (TDMA) networks, Frequency Division Multiple Access (FDMA) networks, Orthogonal FDMA (OFDMA) networks, Single-Carrier FDMA (SC-FDMA) networks, etc. The terms "networks" and "systems" are often used interchangeably. A CDMA network may implement a radio technology such as Universal Terrestrial Radio Access (UTRA), CDMA2000, etc. UTRA includes Wideband-CDMA (W-CDMA) and Low Chip Rate (LCR). CDMA2000 covers IS-2000, IS-95, and IS-856 standards. A TDMA network may implement a radio technology such as Global System for Mobile Communications (GSM). An OFDMA network may implement a radio technology such as Evolved UTRA (E-UTRA), IEEE 802.11, IEEE 802.16, IEEE 802.20, Flash-OFDM®, etc. UTRA, E-UTRA, and GSM are part of Universal Mobile Telecommunication System (UMTS). Long Term Evolution (LTE) is a release of UMTS that uses E-UTRA. UTRA, E-UTRA, GSM, UMTS, and LTE are described in documents from an organization named "3rd Generation Partnership Project" (3GPP). CDMA2000 is described in documents from an organization named "3rd Generation Partnership Project 2" (3GPP2). These communications networks are merely listed as examples of networks in which the techniques described in this disclosure may be applied; however, this disclosure is not limited to the above-described communications network.

Single carrier frequency division multiple access (SC-FDMA) is a transmission technique that utilizes single carrier modulation at a transmitter side and frequency domain equalization at a receiver side. The SC-FDMA has similar performance and essentially the same overall complexity as those of OFDMA system. However, SC-FDMA signal has lower peak-to-average power ratio (PAPR) because of its inherent single carrier structure. The SC-FDMA has drawn attention, especially in the uplink (UL) communications where lower PAPR greatly benefits the wireless node in terms of transmit power efficiency.

An access point ("AP") may comprise, be implemented as, or known as NodeB, Radio Network Controller ("RNC"), eNodeB (eNB), Base Station Controller ("BSC"), Base Transceiver Station ("BTS"), Base Station ("BS"), Transceiver Function ("TF"), Radio Router, Radio Transceiver, Basic Service Set ("BSS"), Extended Service Set ("ESS"), Radio Base Station ("RBS"), or some other terminology.

An access terminal ("AT") may comprise, be implemented as, or be known as an access terminal, a subscriber station, a subscriber unit, a mobile station, a remote station, a remote terminal, a user terminal, a user agent, a user device, user equipment (UE), a user station, a wireless node, or some other terminology. In some implementations, an access terminal may comprise a cellular telephone, a smart phone, a cordless telephone, a Session Initiation Protocol ("SIP") phone, a wireless local loop ("WLL") station, a personal digital assistant ("PDA"), a tablet, a netbook, a smartbook, an ultrabook, a handheld device having wireless connection capability, a Station ("STA"), a wearable device, a drone, a robot/robotic device, or some other suitable processing device connected to a wireless modem. Accordingly, one or more aspects taught herein may be incorporated into a phone (e.g., a cellular phone, a smart phone), a computer (e.g., a desktop), a portable communication device, a portable computing device (e.g., a laptop, a personal data assistant, a tablet, a netbook, a smartbook, an ultrabook), wearable device (e.g., smart watch, smart glasses, smart bracelet, smart wristband, smart ring, smart clothing, etc.), medical/healthcare devices or equipment, biometric sensors/devices, an entertainment device (e.g., music device, video device, satellite radio, gaming device, etc.), a vehicular component or sensor, meters, sensors, industrial manufacturing equipment, a positioning device (e.g., GPS, Glonass, Beidou, terrestrial-based, etc.), a drone, a robot/robotic device, or any other suitable device that is configured to communicate via a wireless or wired medium. In some aspects, the node is a wireless node. A wireless node may provide, for example, connectivity for or to a network (e.g., a wide area network such as the Internet or a cellular network) via a wired or wireless communication link. Some UEs may be considered machine-type communication(s) (MTC) UEs, which may include remote devices, that may communicate with a base station, another remote device, or some other entity. Machine type communications (MTC) may refer to communication involving at least one remote device on at least one end of the communication and may include forms of data communication which involve one or more entities that do not necessarily need human interaction. MTC UEs may include UEs that are capable of MTC communications with MTC servers and/or other MTC devices through Public Land Mobile Networks (PLMN), for example. Examples of MTC devices include sensors, meters, location tags, monitors, drones, robots/robotic devices, etc. MTC UEs, as well as other types of UEs, may be implemented as NB-IoT (narrowband internet of things) devices.

It is noted that while aspects may be described herein using terminology commonly associated with 3G and/or 4G wireless technologies, aspects of the present disclosure can be applied in other generation-based communication systems, such as 5G and later, including new radio (NR) technologies.

NR may refer to radios configured to operate according to a new air interface (e.g., other than Orthogonal Frequency Divisional Multiple Access (OFDMA)-based air interfaces) or fixed transport layer (e.g., other than Internet Protocol (IP)). NR may include Enhanced mobile broadband (eMBB) targeting wide bandwidth (e.g. 80 MHz beyond), millimeter wave (mmW) targeting high carrier frequency (e.g. 60 GHz), massive MTC (mMTC) targeting non-backward compatible MTC techniques, and mission critical targeting ultra reliable low latency communications (URLLC). For these general topics, different techniques are considered, such as coding, low-density parity check (LDPC), and polar. NR cell may refer to a cell operating according to the new air interface or fixed transport layer. A NR Node B (e.g., 5G Node B) may correspond to one or multiple transmission reception points (TRPs).

NR cells can be configured as access cell (ACells) or data only cells (DCells). For example, the RAN (e.g., a central unit or distributed unit) can configure the cells. DCells may be cells used for carrier aggregation or dual connectivity, but not used for initial access, cell selection/reselection, or handover. In some cases DCells may not transmit synchronization signals—in some case cases DCells may transmit SS. TRPs may transmit downlink signals to UEs indicating the cell type. Based on the cell type indication, the UE may communicate with the TRP. For example, the UE may determine TRPs to consider for cell selection, access, handover, and/or measurement based on the indicated cell type.

FIG. 1 shows an exemplary deployment in which aspects of the present disclosure may be practiced.

In certain aspects, a UE (e.g., UE 110) receives a first operational schedule for a base station including a first set of ON periods and a first set of OFF periods, wherein the base station provides a reduced level of service during the OFF periods relative to the ON periods. The UE determines a second operational schedule for the UE including a second set of ON periods and a second set of OFF periods, wherein the UE switches to a battery efficient operation mode during the OFF periods relative to the ON periods. The UE determines, based at least on the first and second operational schedules, whether to perform at least one service associated with the base station.

In certain aspects, a Base Station (BS) (e.g., BS 132 or Node B 122) determines an operational schedule for the base station including at least one ON period and at least one OFF period, wherein the base station provides a reduced level of service during the at least one OFF period relative to the at least one ON period. The base station transmits the determined operational schedule.

FIG. 1 shows an exemplary deployment in which multiple wireless networks have overlapping coverage. A radio access network such as an evolved universal terrestrial radio access network (E-UTRAN) 120 may support LTE and may include a number of Node Bs (NBs) 122 and other network entities that can support wireless communication for user equipments (UEs). Each NB may provide communication coverage for a particular geographic area. The term "cell" can refer to a coverage area of a TRP, NB and/or an NB subsystem serving this coverage area. A serving gateway (S-GW) 124 may communicate with E-UTRAN 120 and may perform various functions such as packet routing and forwarding, mobility anchoring, packet buffering, initiation of network-triggered services, etc. A mobility management entity (MME) 126 may communicate with E-UTRAN 120 and serving gateway 124 and may perform various functions such as mobility management, bearer management, distribution of paging messages, security control, authentication, gateway selection, etc. The network entities in LTE are described in 3GPP TS 36.300, entitled "Evolved Universal Terrestrial Radio Access (E-UTRA) and Evolved Universal Terrestrial Radio Access Network (E-UTRAN); Overall description," which is publicly available.

A radio access network (RAN) 130 may support GSM and may include a number of base stations 132 and other network entities that can support wireless communication for UEs. A mobile switching center (MSC) 134 may communicate with the RAN 130 and may support voice services, provide routing for circuit-switched calls, and perform mobility management for UEs located within the area served by MSC 134. Optionally, an inter-working function (IWF) 140 may facilitate communication between MME 126 and MSC 134 (e.g., for 1×CSFB).

E-UTRAN 120, serving gateway 124, and MME 126 may be part of an LTE network 100. RAN 130 and MSC 134 may be part of a GSM network 104. For simplicity, FIG. 1 shows only some network entities in the LTE network 100 and the GSM network 104. The LTE and GSM networks may also include other network entities that may support various functions and services.

In general, any number of wireless networks may be deployed in a given geographic area. Each wireless network may support a particular RAT and may operate on one or more frequencies. A RAT may also be referred to as a radio technology, an air interface, etc. A frequency may also be referred to as a carrier, a frequency channel, etc. Each frequency may support a single RAT in a given geographic area in order to avoid interference between wireless networks of different RATs.

The system illustrated in FIG. 1 may include, for example, a long term evolution (LTE) network 120 and a GMS network 130. According to aspects, the system illustrated in FIG. 1 may include one or more other networks, such as a NR network. The NR may include may include a number of Node Bs (e.g., evolved NodeBs (eNB), 5G Node B, TRPs etc.) 110 and other network entities. A Node B may be a station that communicates with the UEs and may also be referred to as a base station, an access point, etc. A Node B and 5G Node B are other examples of stations that communicates with the UEs.

Each Node B 110 may provide communication coverage for a particular geographic area. In 3GPP, the term "cell" can refer to a coverage area of a Node B and/or a Node B subsystem serving this coverage area, depending on the context in which the term is used. In NR systems, the term "cell" and TRP may be interchangeable.

A UE 110 may be stationary or mobile and may also be referred to as a mobile station, a terminal, an access terminal, a subscriber unit, a station, etc. UE 110 may be a cellular phone, a personal digital assistant (PDA), a wireless modem, a wireless communication device, a handheld device, a laptop computer, a cordless phone, a wireless local loop (WLL) station, etc. In aspects, UE 110 may be a Dual SIM dual standby (DSDS) UE.

Upon power up, UE 110 may search for wireless networks from which it can receive communication services. If more than one wireless network is detected, then a wireless network with the highest priority may be selected to serve UE 110 and may be referred to as the serving network. UE 110 may perform registration with the serving network, if necessary. UE 110 may then operate in a connected mode to actively communicate with the serving network. Alternatively, UE 110 may operate in an idle mode and camp on the serving network if active communication is not required by UE 110.

UE 110 may be located within the coverage of cells of multiple frequencies and/or multiple RATs while in the idle mode. For LTE, UE 110 may select a frequency and a RAT to camp on based on a priority list. This priority list may include a set of frequencies, a RAT associated with each frequency, and a priority of each frequency. For example, the priority list may include three frequencies X, Y and Z. Frequency X may be used for LTE and may have the highest priority, frequency Y may be used for GSM and may have the lowest priority, and frequency Z may also be used for GSM and may have medium priority. In general, the priority list may include any number of frequencies for any set of RATs and may be specific for the UE location. UE 110 may be configured to prefer LTE, when available, by defining the priority list with LTE frequencies at the highest priority and with frequencies for other RATs at lower priorities, e.g., as given by the example above.

UE 110 may operate in the idle mode as follows. UE 110 may identify all frequencies/RATs on which it is able to find a "suitable" cell in a normal scenario or an "acceptable" cell in an emergency scenario, where "suitable" and "acceptable" are specified in the LTE standards. UE 110 may then camp on the frequency/RAT with the highest priority among all identified frequencies/RATs. UE 110 may remain camped on this frequency/RAT until either (i) the frequency/RAT is no longer available at a predetermined threshold or (ii) another frequency/RAT with a higher priority reaches this threshold. This operating behavior for UE 110 in the idle mode is described in 3GPP TS 36.304, entitled "Evolved Universal Terrestrial Radio Access (E-UTRA); User Equipment (UE) procedures in idle mode," which is publicly available.

UE 110 may be able to receive packet-switched (PS) data services from LTE network 100 and may camp on the LTE network while in the idle mode. LTE network 100 may have limited or no support for voice-over-Internet protocol (VoIP), which may often be the case for early deployments of LTE networks. Due to the limited VoIP support, UE 110 may be transferred to another wireless network of another RAT for voice calls. This transfer may be referred to as circuit-switched (CS) fallback. UE 110 may be transferred to a RAT that can support voice service such as 1×RTT, WCDMA, GSM, etc. For call origination with CS fallback, UE 110 may initially become connected to a wireless network of a source RAT (e.g., LTE) that may not support voice service. The UE may originate a voice call with this wireless network and may be transferred through higher-layer signaling to another wireless network of a target RAT that can support the voice call. The higher-layer signaling to transfer the UE to the target RAT may be for various procedures, e.g., connection release with redirection, PS handover, etc.

While aspects of the examples described herein may be associated with LTE technologies, aspects of the present disclosure may be applicable with other wireless communications systems, such as NR. NR may utilize OFDM with a CP on the uplink and downlink and include support for half-duplex operation using TDD. A single component carrier bandwidth of 100 MHZ may be supported. NR resource blocks may span 12 sub-carriers with a sub-carrier bandwidth of 75 kHz over a 0.1 ms duration. Each radio frame may consist of 50 subframes with a length of 10 ms. Consequently, each subframe may have a length of 0.2 ms. Each subframe may indicate a link direction (i.e., DL or UL) for data transmission and the link direction for each subframe may be dynamically switched. Each subframe may include DL/UL data as well as DL/UL control data. Beamforming may be supported and beam direction may be dynamically configured. MIMO transmissions with precoding may also be supported. MIMO configurations in the DL may support up to 8 transmit antennas with multi-layer DL transmissions up to 8 streams and up to 2 streams per UE. Multi-layer transmissions with up to 2 streams per UE may be supported. Aggregation of multiple cells may be supported with up to 8 serving cells. Alternatively, NR may support a different air interface, other than an OFDM-based. NR networks may include entities such central units or distributed units.

Figure 2:
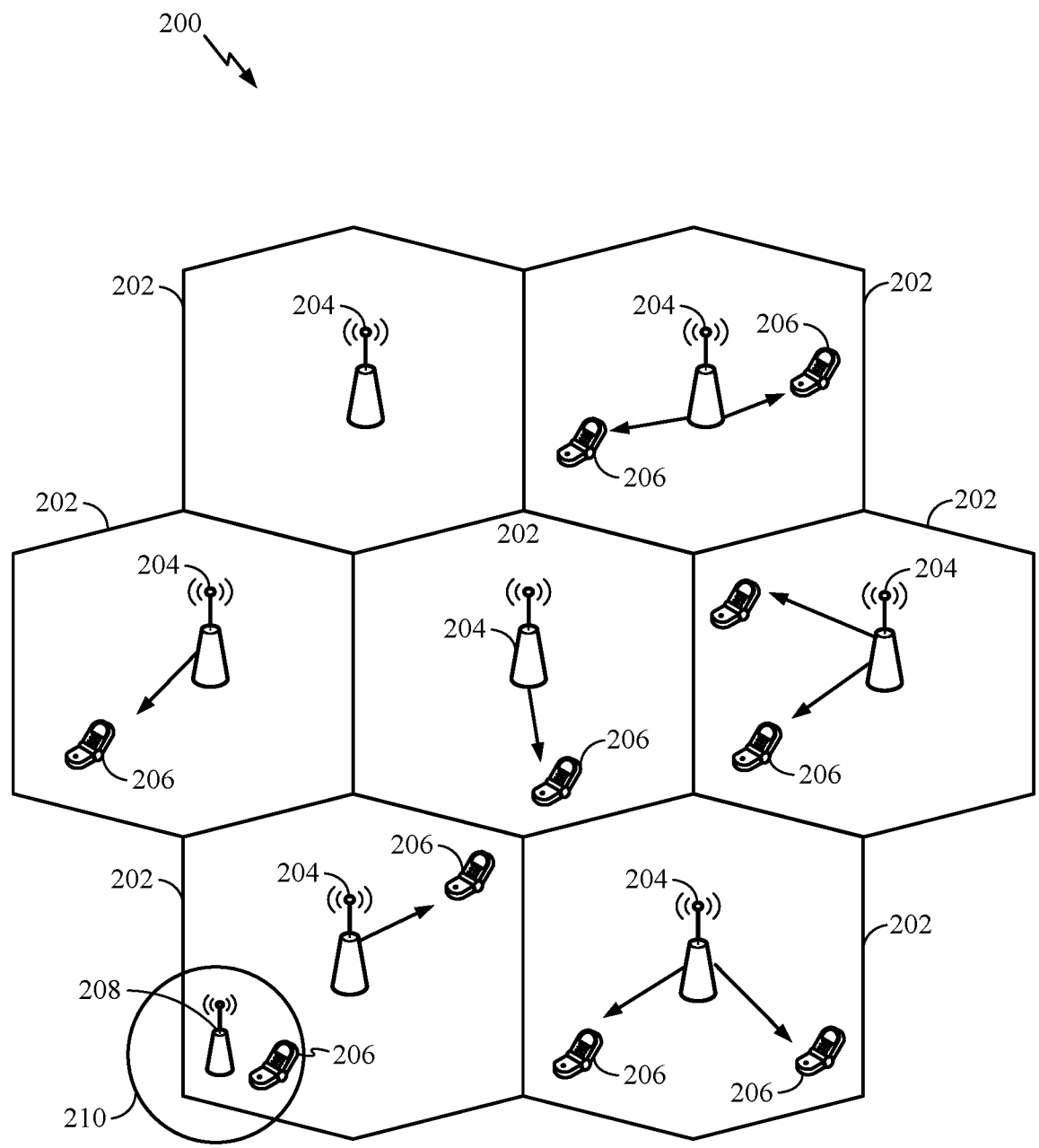
FIG. 2 is a diagram illustrating an example of an access network according to some embodiments.

FIG. 2 is a diagram illustrating an example of an access network 200 in which aspects of the present disclosure may be practiced. For example, UEs 206 and NodeBs (NBs) 204 may be configured to implement techniques for implementing a cell DTX schedule in accordance with aspects of the present disclosure.

In FIG. 2, the access network 200 is divided into a number of cellular regions (cells) 202. One or more lower power class Node Bs 208 may have cellular regions 210 that overlap with one or more of the cells 202. A lower power class Node B 208 may be referred to as a remote radio head (RRH). The lower power class e Node B NB 208 may be a femto cell (e.g., home Node B (H Node B)), pico cell, or micro cell. The macro Node Bs 204 are each assigned to a respective cell 202 and are configured to provide an access point to the EPC 110 for all the UEs 206 in the cells 202. There is no centralized controller in this example of an access network 200, but a centralized controller may be used in alternative configurations. The Node Bs 204 are responsible for all radio related functions including radio bearer control, admission control, mobility control, scheduling, security, and connectivity to the serving gateway.

The modulation and multiple access scheme employed by the access network 200 may vary depending on the particular telecommunications standard being deployed. In LTE applications, OFDM is used on the DL and SC-FDMA is used on the UL to support both frequency division duplexing (FDD) and time division duplexing (TDD). As those skilled in the art will readily appreciate from the detailed description to follow, the various concepts presented herein are well suited for LTE applications. However, these concepts may be readily extended to other telecommunication standards employing other modulation and multiple access techniques. By way of example, these concepts may be extended to Evolution-Data Optimized (EV-DO) or Ultra Mobile Broadband (UMB). EV-DO and UMB are air interface standards promulgated by the 3rd Generation Partnership Project 2 (3GPP2) as part of the CDMA2000 family of standards and employs CDMA to provide broadband Internet access to mobile stations. These concepts may also be extended to Universal Terrestrial Radio Access (UTRA) employing Wideband-CDMA (W-CDMA) and other variants of CDMA, such as TD-SCDMA; Global System for Mobile Communications (GSM) employing TDMA; and Evolved UTRA (E-UTRA), Ultra Mobile Broadband (UMB), IEEE 802.11 (Wi-Fi), IEEE 802.16 (WiMAX), IEEE 802.20, and Flash-OFDM employing OFDMA. UTRA, E-UTRA, UMTS, LTE and GSM are described in documents from the 3GPP organization. CDMA2000 and UMB are described in documents from the 3GPP2 organization. The actual wireless communication standard and the multiple access technology employed will depend on the specific application and the overall design constraints imposed on the system.

The Node B 204 may have multiple antennas supporting MIMO technology. The use of MIMO technology enables the Node Bs 204 to exploit the spatial domain to support spatial multiplexing, beamforming, and transmit diversity. Spatial multiplexing may be used to transmit different streams of data simultaneously on the same frequency. The data steams may be transmitted to a single UE 206 to increase the data rate or to multiple UEs 206 to increase the overall system capacity. This is achieved by spatially precoding each data stream (e.g., applying a scaling of an amplitude and a phase) and then transmitting each spatially precoded stream through multiple transmit antennas on the DL. The spatially precoded data streams arrive at the UE(s) 206 with different spatial signatures, which enables each of the UE(s) 206 to recover the one or more data streams destined for that UE 206. On the UL, each UE 206 transmits a spatially precoded data stream, which enables the Node B 204 to identify the source of each spatially precoded data stream.

Spatial multiplexing is generally used when channel conditions are good. When channel conditions are less favorable, beamforming may be used to focus the transmission energy in one or more directions. This may be achieved by spatially precoding the data for transmission through multiple antennas. To achieve good coverage at the edges of the cell, a single stream beamforming transmission may be used in combination with transmit diversity.

In the detailed description that follows, various aspects of an access network will be described with reference to a MIMO system supporting OFDM on the DL. OFDM is a spread-spectrum technique that modulates data over a number of subcarriers within an OFDM symbol. The subcarriers are spaced apart at precise frequencies. The spacing provides "orthogonality" that enables a receiver to recover the data from the subcarriers. In the time domain, a guard interval (e.g., cyclic prefix) may be added to each OFDM symbol to combat inter-OFDM-symbol interference. The UL may use SC-FDMA in the form of a DFT-spread OFDM signal to compensate for high peak-to-average power ratio (PAPR).

Figure 3:
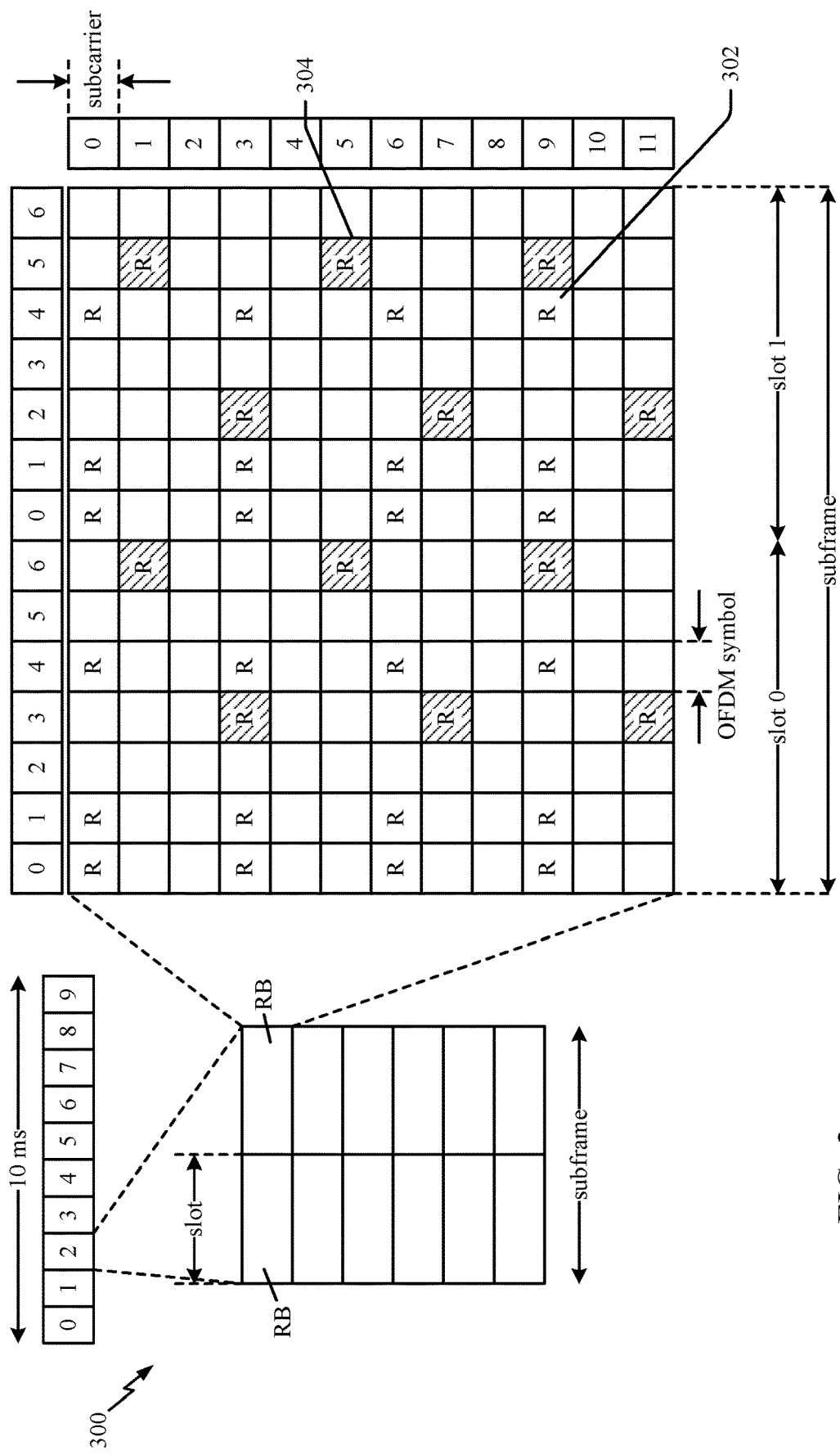
FIG. 3 is a diagram illustrating an example of a DL frame structure in LTE according to some embodiments.

FIG. 3 is a diagram 300 illustrating an example of a DL frame structure in a telecommunications system (e.g., LTE). A frame (10 ms) may be divided into 10 equally sized sub-frames with indices of 0 through 9. Each sub-frame may include two consecutive time slots. A resource grid may be used to represent two time slots, each time slot including a resource block. The resource grid is divided into multiple resource elements. In LTE, a resource block contains 12 consecutive subcarriers in the frequency domain and, for a normal cyclic prefix in each OFDM symbol, 7 consecutive OFDM symbols in the time domain, or 84 resource elements. For an extended cyclic prefix, a resource block contains 6 consecutive OFDM symbols in the time domain and has 72 resource elements. Some of the resource elements, as indicated as R 302, 304, include DL reference signals (DL-RS). The DL-RS include Cell-specific RS (CRS) (also sometimes called common RS) 302 and UE-specific RS (UE-RS) 304. UE-RS 304 are transmitted only on the resource blocks upon which the corresponding physical DL shared channel (PDSCH) is mapped. The number of bits carried by each resource element depends on the modulation scheme. Thus, the more resource blocks that a UE receives and the higher the modulation scheme, the higher the data rate for the UE.

In LTE, a Node B may send a primary synchronization signal (PSS) and a secondary synchronization signal (SSS) for each cell in the Node B. The primary and secondary synchronization signals may be sent in symbol periods 6 and 5, respectively, in each of subframes 0 and 5 of each radio frame with the normal cyclic prefix (CP). The synchronization signals may be used by UEs for cell detection and acquisition. The Node B may send a Physical Broadcast Channel (PBCH) in symbol periods 0 to 3 in slot 1 of subframe 0. The PBCH may carry certain system information.

The Node B may send a Physical Control Format Indicator Channel (PCFICH) in the first symbol period of each subframe. The PCFICH may convey the number of symbol periods (M) used for control channels, where M may be equal to 1, 2 or 3 and may change from subframe to subframe. M may also be equal to 4 for a small system bandwidth, e.g., with less than 10 resource blocks. The Node B may send a Physical HARQ Indicator Channel (PHICH) and a Physical Downlink Control Channel (PDCCH) in the first M symbol periods of each subframe. The PHICH may carry information to support hybrid automatic repeat request (HARQ). The PDCCH may carry information on resource allocation for UEs and control information for downlink channels. The Node B may send a Physical Downlink Shared Channel (PDSCH) in the remaining symbol periods of each subframe. The PDSCH may carry data for UEs scheduled for data transmission on the downlink.

The Node B may send the PSS, SSS, and PBCH in the center 1.08 MHz of the system bandwidth used by the Node B. The Node B may send the PCFICH and PHICH across the entire system bandwidth in each symbol period in which these channels are sent. The Node B may send the PDCCH to groups of UEs in certain portions of the system bandwidth. The Node B may send the PDSCH to specific UEs in specific portions of the system bandwidth. The Node B may send the PSS, SSS, PBCH, PCFICH, and PHICH in a broadcast manner to all UEs, may send the PDCCH in a unicast manner to specific UEs, and may also send the PDSCH in a unicast manner to specific UEs. A number of resource elements may be available in each symbol period. Each resource element (RE) may cover one subcarrier in one symbol period and may be used to send one modulation symbol, which may be a real or complex value. Resource elements not used for a reference signal in each symbol period may be arranged into resource element groups (REGs). Each REG may include four resource elements in one symbol period. The PCFICH may occupy four REGs, which may be spaced approximately equally across frequency, in symbol period 0. The PHICH may occupy three REGs, which may be spread across frequency, in one or more configurable symbol periods. For example, the three REGs for the PHICH may all belong in symbol period 0 or may be spread in symbol periods 0, 1, and 2. The PDCCH may occupy 9, 18, 36, or 72 REGs, which may be selected from the available REGs, in the first M symbol periods, for example. Only certain combinations of REGs may be allowed for the PDCCH.

A UE may know the specific REGs used for the PHICH and the PCFICH. The UE may search different combinations of REGs for the PDCCH. The number of combinations to search is typically less than the number of allowed combinations for the PDCCH. A Node B may send the PDCCH to the UE in any of the combinations that the UE will search.

Figure 4:
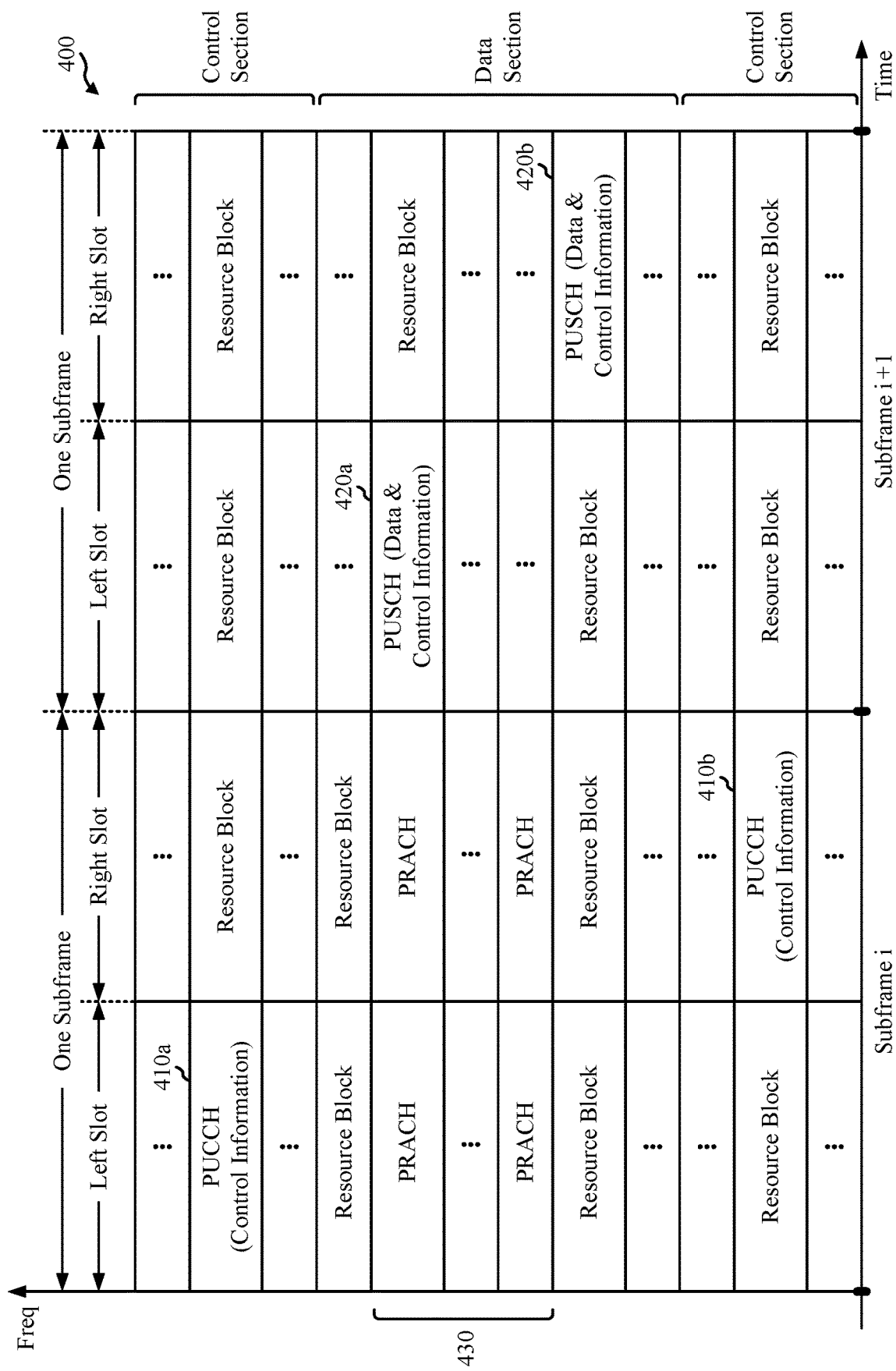
FIG. 4 is a diagram illustrating an example of an UL frame structure in LTE according to some embodiments.

FIG. 4 is a diagram 400 illustrating an example of an UL frame structure in telecommunications system (e.g., LTE). The available resource blocks for the UL may be partitioned into a data section and a control section. The control section may be formed at the two edges of the system bandwidth and may have a configurable size. The resource blocks in the control section may be assigned to UEs for transmission of control information. The data section may include all resource blocks not included in the control section. The UL frame structure results in the data section including contiguous subcarriers, which may allow a single UE to be assigned all of the contiguous subcarriers in the data section.

A UE may be assigned resource blocks in the control section to transmit control information to a Node B. The UE may also be assigned resource blocks in the data section to transmit data to the Node B. The UE may transmit control information in a physical UL control channel (PUCCH) on the assigned resource blocks in the control section. The UE may transmit only data or both data and control information in a physical UL shared channel (PUSCH) on the assigned resource blocks in the data section. A UL transmission may span both slots of a subframe and may hop across frequency.

A set of resource blocks may be used to perform initial system access and achieve UL synchronization in a physical random access channel (PRACH) 430. The PRACH 430 carries a random sequence and cannot carry any UL data/signaling. Each random access preamble occupies a bandwidth corresponding to six consecutive resource blocks. The starting frequency is specified by the network. That is, the transmission of the random access preamble is restricted to certain time and frequency resources. There is no frequency hopping for the PRACH. The PRACH attempt is carried in a single subframe (1 ms) or in a sequence of few contiguous subframes and a UE can make only a single PRACH attempt per frame (10 ms).

Figure 5:
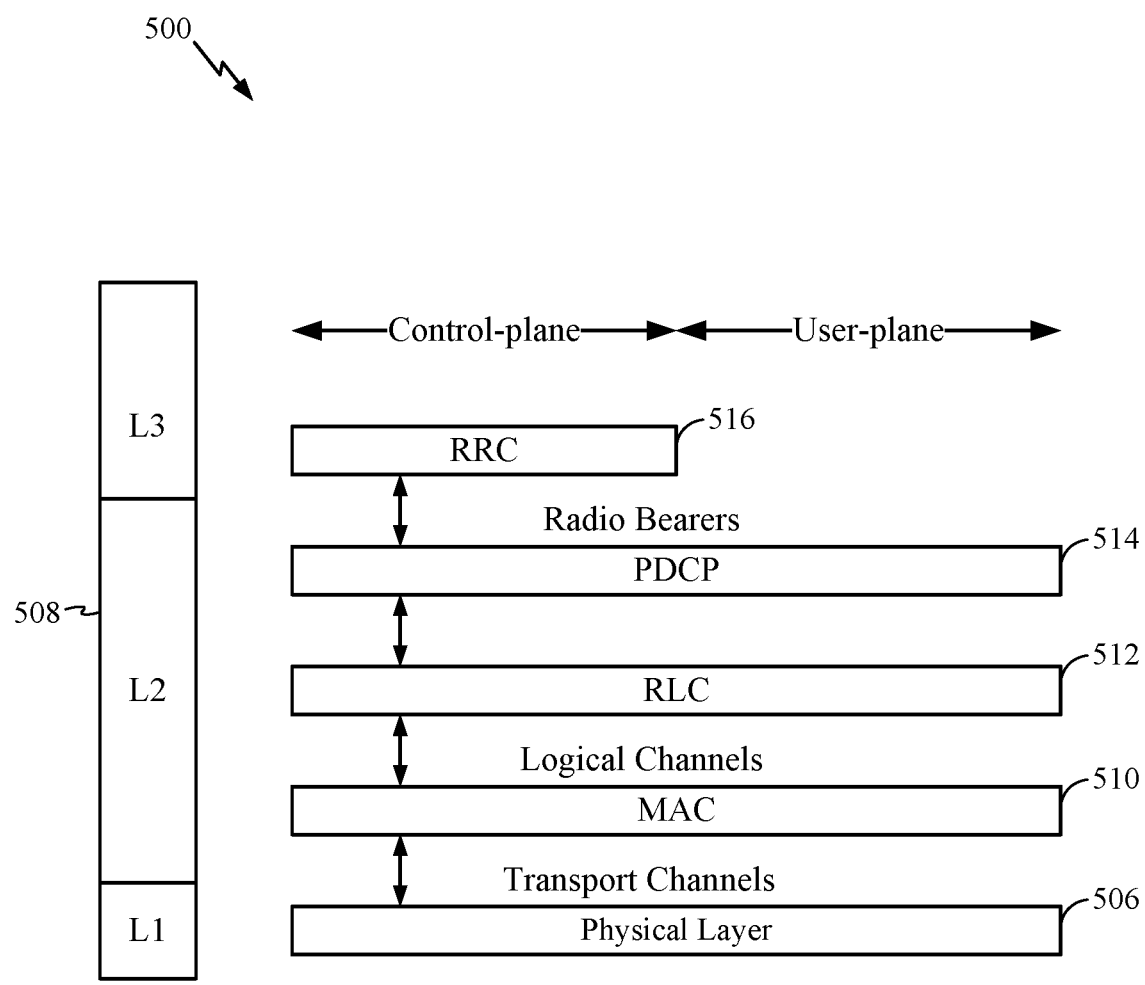
FIG. 5 is a diagram illustrating an example of a radio protocol architecture for the user and control planes according to some embodiments.

FIG. 5 is a diagram 500 illustrating an example of a radio protocol architecture for the user and control planes in LTE. The radio protocol architecture for the UE and the Node B is shown with three layers: Layer 1, Layer 2, and Layer 3. Layer 1 (L1 layer) is the lowest layer and implements various physical layer signal processing functions. The L1 layer will be referred to herein as the physical layer 506. Layer 2 (L2 layer) 508 is above the physical layer 506 and is responsible for the link between the UE and Node B over the physical layer 506.

In the user plane, the L2 layer 508 includes a media access control (MAC) sublayer 510, a radio link control (RLC) sublayer 512, and a packet data convergence protocol (PDCP) 514 sublayer, which are terminated at the Node B on the network side. Although not shown, the UE may have several upper layers above the L2 layer 508 including a network layer (e.g., IP layer) that is terminated at the PDN gateway 118 on the network side, and an application layer that is terminated at the other end of the connection (e.g., far end UE, server, etc.).

The PDCP sublayer 514 provides multiplexing between different radio bearers and logical channels. The PDCP sublayer 514 also provides header compression for upper layer data packets to reduce radio transmission overhead, security by ciphering the data packets, and handover support for UEs between Node Bs. The RLC sublayer 512 provides segmentation and reassembly of upper layer data packets, retransmission of lost data packets, and reordering of data packets to compensate for out-of-order reception due to hybrid automatic repeat request (HARQ). The MAC sublayer 510 provides multiplexing between logical and transport channels. The MAC sublayer 510 is also responsible for allocating the various radio resources (e.g., resource blocks) in one cell among the UEs. The MAC sublayer 510 is also responsible for HARQ operations.

In the control plane, the radio protocol architecture for the UE and Node B is substantially the same for the physical layer 506 and the L2 layer 508 with the exception that there is no header compression function for the control plane. The control plane also includes a radio resource control (RRC) sublayer 516 in Layer 3 (L3 layer). The RRC sublayer 516 is responsible for obtaining radio resources (i.e., radio bearers) and for configuring the lower layers using RRC signaling between the Node B and the UE.

Figure 6:
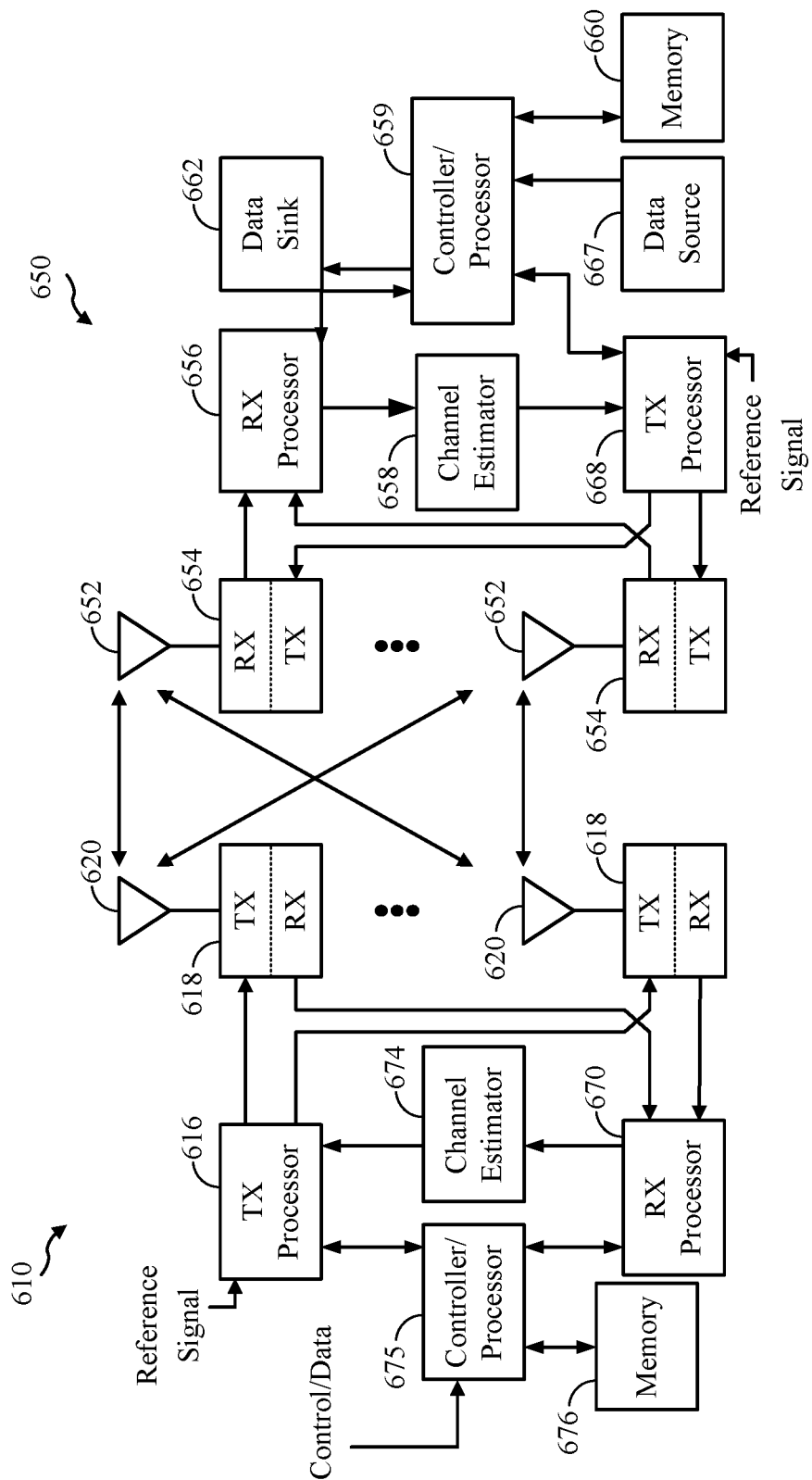
FIG. 6 is a diagram illustrating an example of a base station and user equipment in an access network, in accordance with certain aspects of the disclosure.

FIG. 6 is a block diagram of a Node B 610 in communication with a UE 650 in an access network, in which aspects of the present disclosure may be practiced.

In certain aspects, a UE (e.g., UE 650) receives a first operational schedule for a base station including a first set of ON periods and a first set of OFF periods, wherein the base station provides a reduced level of service during the OFF periods relative to the ON periods. The UE determines a second operational schedule for the UE including a second set of ON periods and a second set of OFF periods, wherein the UE switches to a battery efficient operation mode during the OFF periods relative to the ON periods. The UE determines, based at least on the first and second operational schedules, whether to perform at least one service associated with the base station.

In certain aspects, a Base Station (BS) (e.g., Node B 610) determines an operational schedule for the base station including at least one ON period and at least one OFF period, wherein the base station provides a reduced level of service during the at least one OFF period relative to the at least one ON period. The base station transmits the determined operational schedule.

It may be noted that the UE noted above for implementing the flexible bandwidth operation in accordance with certain aspects of the present disclosure may be implemented by a combination of one or more of the controller 659, the RX processor 656, the channel estimator 658 and/or transceiver 654 at the UE 650, for example. Further, the BS may be implemented by a combination of one or more of the controller 675, the TX processor and/or the transceiver 618 at the Node B 610.

In the DL, upper layer packets from the core network are provided to a controller/processor 675. The controller/processor 675 implements the functionality of the L2 layer. In the DL, the controller/processor 675 provides header compression, ciphering, packet segmentation and reordering, multiplexing between logical and transport channels, and radio resource allocations to the UE 650 based on various priority metrics. The controller/processor 675 is also responsible for HARQ operations, retransmission of lost packets, and signaling to the UE 650.

The TX processor 616 implements various signal processing functions for the L1 layer (i.e., physical layer). The signal processing functions includes coding and interleaving to facilitate forward error correction (FEC) at the UE 650 and mapping to signal constellations based on various modulation schemes (e.g., binary phase-shift keying (BPSK), quadrature phase-shift keying (QPSK), M-phase-shift keying (M-PSK), M-quadrature amplitude modulation (M-QAM)). The coded and modulated symbols are then split into parallel streams. Each stream is then mapped to an OFDM subcarrier, multiplexed with a reference signal (e.g., pilot) in the time and/or frequency domain, and then combined together using an Inverse Fast Fourier Transform (IFFT) to produce a physical channel carrying a time domain OFDM symbol stream. The OFDM stream is spatially precoded to produce multiple spatial streams. Channel estimates from a channel estimator 674 may be used to determine the coding and modulation scheme, as well as for spatial processing. The channel estimate may be derived from a reference signal and/or channel condition feedback transmitted by the UE 650. Each spatial stream is then provided to a different antenna 620 via a separate transmitter 618TX. Each transmitter 618TX modulates an RF carrier with a respective spatial stream for transmission.

At the UE 650, each receiver 654RX receives a signal through its respective antenna 652. Each receiver 654RX recovers information modulated onto an RF carrier and provides the information to the receiver (RX) processor 656. The RX processor 656 implements various signal processing functions of the L1 layer. The RX processor 656 performs spatial processing on the information to recover any spatial streams destined for the UE 650. If multiple spatial streams are destined for the UE 650, they may be combined by the RX processor 656 into a single OFDM symbol stream. The RX processor 656 then converts the OFDM symbol stream from the time-domain to the frequency domain using a Fast Fourier Transform (FFT). The frequency domain signal comprises a separate OFDM symbol stream for each subcarrier of the OFDM signal. The symbols on each subcarrier, and the reference signal, is recovered and demodulated by determining the most likely signal constellation points transmitted by the Node B 610. These soft decisions may be based on channel estimates computed by the channel estimator 658. The soft decisions are then decoded and deinterleaved to recover the data and control signals that were originally transmitted by the Node B 610 on the physical channel. The data and control signals are then provided to the controller/processor 659.

The controller/processor 659 implements the L2 layer. The controller/processor can be associated with a memory 660 that stores program codes and data. The memory 660 may be referred to as a computer-readable medium. In the UL, the controller/processor 659 provides demultiplexing between transport and logical channels, packet reassembly, deciphering, header decompression, control signal processing to recover upper layer packets from the core network. The upper layer packets are then provided to a data sink 662, which represents all the protocol layers above the L2 layer. Various control signals may also be provided to the data sink 662 for L3 processing. The controller/processor 659 is also responsible for error detection using an acknowledgement (ACK) and/or negative acknowledgement (NACK) protocol to support HARQ operations.

In the UL, a data source 667 is used to provide upper layer packets to the controller/processor 659. The data source 667 represents all protocol layers above the L2 layer. Similar to the functionality described in connection with the DL transmission by the Node B 610, the controller/processor 659 implements the L2 layer for the user plane and the control plane by providing header compression, ciphering, packet segmentation and reordering, and multiplexing between logical and transport channels based on radio resource allocations by the Node B 610. The controller/processor 659 is also responsible for HARQ operations, retransmission of lost packets, and signaling to the Node B 610.

Channel estimates derived by a channel estimator 658 from a reference signal or feedback transmitted by the Node B 610 may be used by the TX processor 668 to select the appropriate coding and modulation schemes, and to facilitate spatial processing. The spatial streams generated by the TX processor 668 are provided to different antenna 652 via separate transmitters 654TX. Each transmitter 654TX modulates an RF carrier with a respective spatial stream for transmission.

The UL transmission is processed at the Node B 610 in a manner similar to that described in connection with the receiver function at the UE 650. Each receiver 618RX receives a signal through its respective antenna 620. Each receiver 618RX recovers information modulated onto an RF carrier and provides the information to a RX processor 670. The RX processor 670 may implement the L1 layer.

The controller/processor 675 implements the L2 layer. The controller/processor 675 can be associated with a memory 676 that stores program codes and data. The memory 676 may be referred to as a computer-readable medium. In the UL, the controller/processor 675 provides demultiplexing between transport and logical channels, packet reassembly, deciphering, header decompression, control signal processing to recover upper layer packets from the UE 650. Upper layer packets from the controller/processor 675 may be provided to the core network. The controller/processor 675 is also responsible for error detection using an ACK and/or NACK protocol to support HARQ operations. The controllers/processors 675, 659 may direct the operations at the Node B 610 and the UE 650, respectively.

Figure 7:
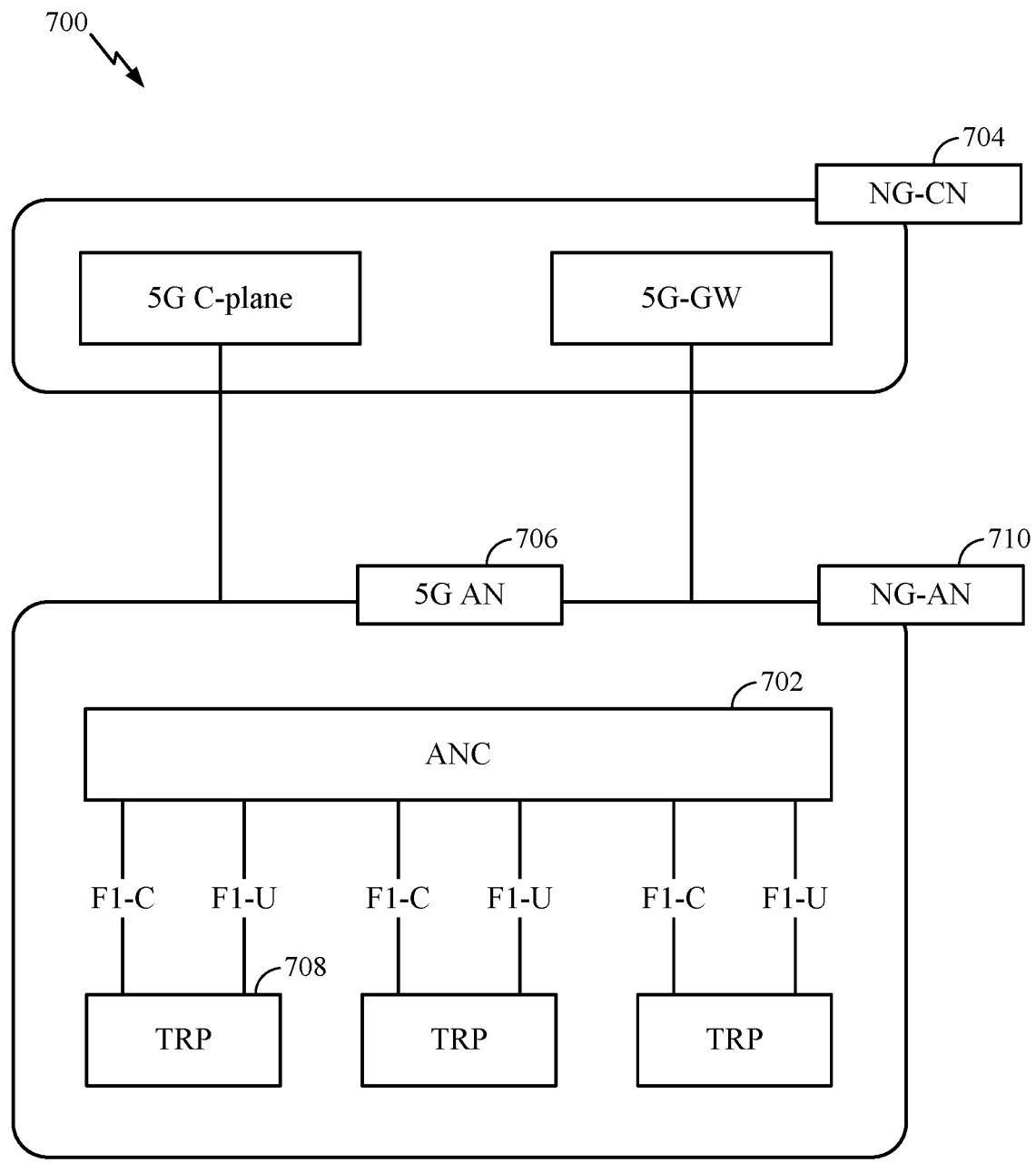
FIG. 7 illustrates a logical architecture of a distributed RAN, in accordance with certain aspects of the present disclosure.
Figure 8:
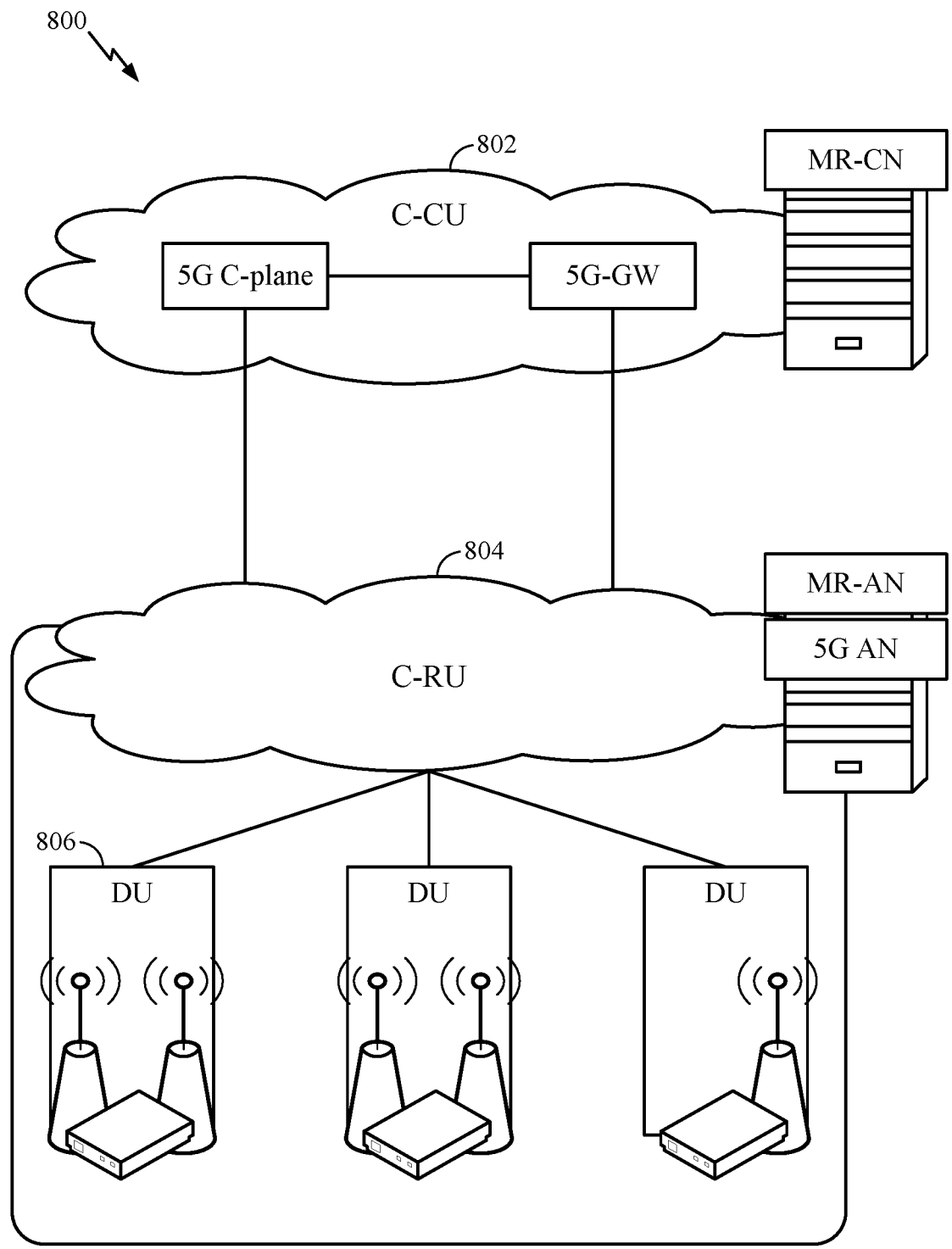
FIG. 8 illustrates an example physical architecture of a distributed RAN, in accordance with certain aspects of the present disclosure.

The controller/processor 659 and/or other processors, components and/or modules at the UE 650 may perform or direct operations, for example, operations 800 in FIG. 8, and/or other processes for the techniques described herein for implementing the new transmission scheme. Further, the controller/processor 675 and/or other processors, components and/or modules at the Node B 610 may perform or direct operations, for example, operations 700 in FIG. 7, and/or other processes for the techniques described herein for implementing the new transmission scheme. In certain aspects, one or more of any of the components shown in FIG. 6 may be employed to perform example operations 700 and 800, and/or other processes for the techniques described herein. The memories 660 and 676 may store data and program codes for the UE 650 and Node B 610 respectively, accessible and executable by one or more other components of the UE 650 and the Node B 610.

FIG. 7 illustrates an example logical architecture of a distributed RAN 700, according to aspects of the present disclosure. A 5G access node 706 may include an access node controller (ANC) 702. The ANC may be a central unit of the distributed RAN 700. The backhaul interface to the next generation core network (NG-CN) 704 may terminate at the ANC. The backhaul interface to neighboring next generation access nodes (NG-ANs) may terminate at the ANC. The ANC may include one or more TRPs 708. As described above, a TRP may be used interchangeably with "cell."

The TRPs 708 may be a distributed unit. The TRPs may be connected to one ANC or more than one ANC (not illustrated). For example, for RAN sharing, radio as a service (RaaS), and service specific AND deployments, the TRP may be connected to more than one ANC. A TRP may include one or more antenna ports. The TRPs may be configured to individually (e.g., dynamic selection) or jointly (e.g., joint transmission) serve traffic to a UE.

The local architecture 700 may be used to illustrate fronthaul definition. The architecture may be defined that support fronthauling solutions across different deployment types. For example, the architecture may be based on transmit network capabilities (e.g., bandwidth, latency, and/or jitter).

The architecture may share features and/or components with LTE. According to aspects, the next generation AN (NG-AN) 710 may support dual connectivity with NR. The NG-AN may share a common fronthaul for LTE and NR.

The architecture may enable cooperation between and among TRPs 708. For example, cooperation may be preset within a TRP and/or across TRPs via the ANC 702. According to aspects, no inter-TRP interface may be needed/present.

According to aspects, a dynamic configuration of split logical functions may be present within the architecture 700. The PDCP, RLC, MAC protocol may be adaptably placed at the ANC or TRP.

FIG. 8 illustrates an example physical architecture of a distributed RAN 800, according to aspects of the present disclosure. A centralized core network unit (C-CU) 802 may host core network functions. The C-CU may be centrally deployed. C-CU functionality may be offloaded (e.g., to advanced wireless services (AWS)), in an effort to handle peak capacity.

A centralized RAN unit (C-RU) 804 may host one or more ANC functions. Optionally, the C-RU may host core network functions locally. The C-RU may have distributed deployment. The C-RU may be closer to the network edge.

A distributed unit (DU) 806 may host one or more TRPs. The DU may be located at edges of the network with radio frequency (RF) functionality.

It may be noted that the terms base station and cell are used interchangeably throughout this disclosure and include ANC and one or more DUs (e.g. TRPs).

Example Techniques for Coordinating Capability Across Rats

In current systems, such as UMTS and LTE network deployments, the increasing size of information bits needed to convey UE capabilities can be problematic. Going into new radio (NR) systems, the problems may be even more challenging, due to additional capabilities and issued related to increased inter-RAT dependency, particular hardware designs, and the possibility of a UE to adapt its capabilities over time.

Current approaches to conveying UE capability information may be unsuitable for NR deployments. For example, for 3G, the UE capabilities are sent at every RRC connection. While this scheme indirectly offered the UE some flexibility in terms of being able to change its capabilities with time, however, it consumes a significant amout of system resources. This this scheme worked relatively well initially when the UE capabilities sizes were relatively small. As the UMTS capability started expanding, and subsequently carried the LTE capabilities, including all the band combinations for carrier aggregation, however, the amount of information bits required to carry the information rapidly expanded. As a result, call setups may fail, especially in bad radio conditions, as the transmission of these capabilities was taking so long that the network sometimes releases the RRC connection.

For LTE, the UE capabilities is not sent with every RRC connection. Instead, the network saves the UE capabilities and moves that information around following the UE mobility, thus avoiding the repeated transmissions over the air. This scheme may also be applied when the UE moves from UMTS to LTE, so the UE was supposed to send all its capabilities while in UMTS. However, even this scheme can fail for various reasons. For example, in some cases, the capability size may expand to the points where some older implementations are unable to handle it and drop the it half way, creating network attachment problems. While the information may be requested via a network-only initiated query, this may leave the UE with a rigid set of signaled capabilities that are difficult to update.

Aspects of the present disclosure may help address these problems by effectively disassociating capabilities per RAT and taking into account dependencies between RATs. As will be described in greater detail herein, in some cases, sets or groups of capabilities that are possible across RAT, based on inter-RAT dependencies, may be specified. In some cases, entities from two RATs may communicate regarding the capabilities of a UE. Once the two RATs agree on a set (for the UE to use), each RAT is free to choose any capability within that set. If there is no coordination between RATs, then, the UE may be able to inform the network of the set being used by the other RATs, or alternatively, the UE may be able to re-negotiate its capabilities dynamically.

Figure 9:
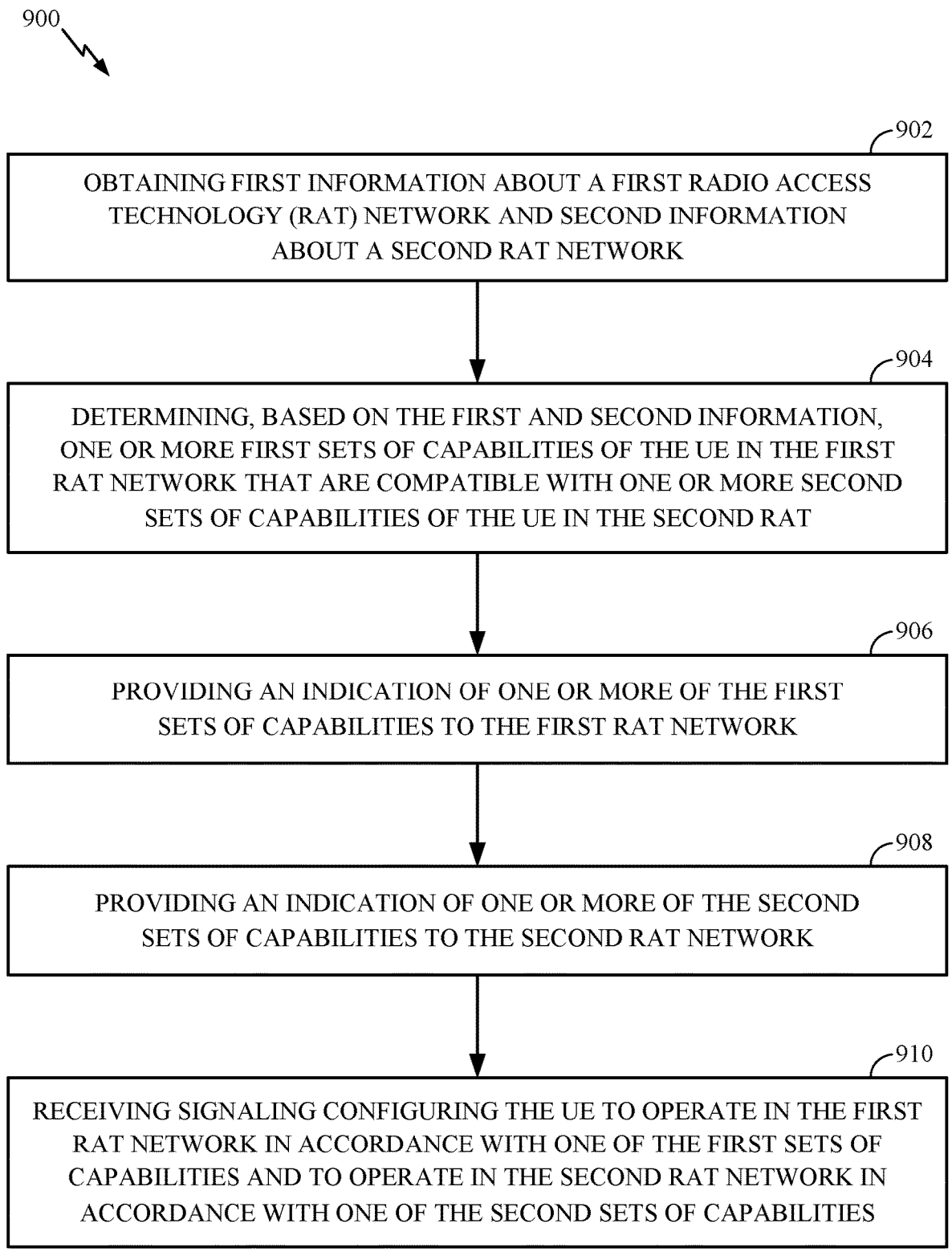
FIG. 9 illustrates example operations for wireless communications by a wireless node, such as a user equipment (UE), in accordance with certain aspects of the present disclosure.

FIG. 9 illustrates example operations 900 for coordinating capabilities across RATs that may be performed by a wireless node (e.g., a UE), to report capabilities in accordance with certain aspects of the present disclosure.

Operations 900 begin, at 902 by obtaining first information about a first radio access technology (RAT) network and second information about a second RAT network. At 904, the UE determines, based on the first and second information, one or more first sets of capabilities of the UE in the first RAT network that are compatible with one or more second sets of capabilities of the UE in the second RAT. At 906, the UE provides an indication of one or more first sets of capabilities to the first RAT network (based on the determination at 904). At 908, the UE provides an indication of one or more second sets of capabilities to the second RAT network.

At 910, the UE receives signaling configuring the UE to operate in the first RAT network in accordance with one of the first sets of capabilities and to operate in the second RAT network in accordance with one of the second sets of capabilities.

Figure 10:
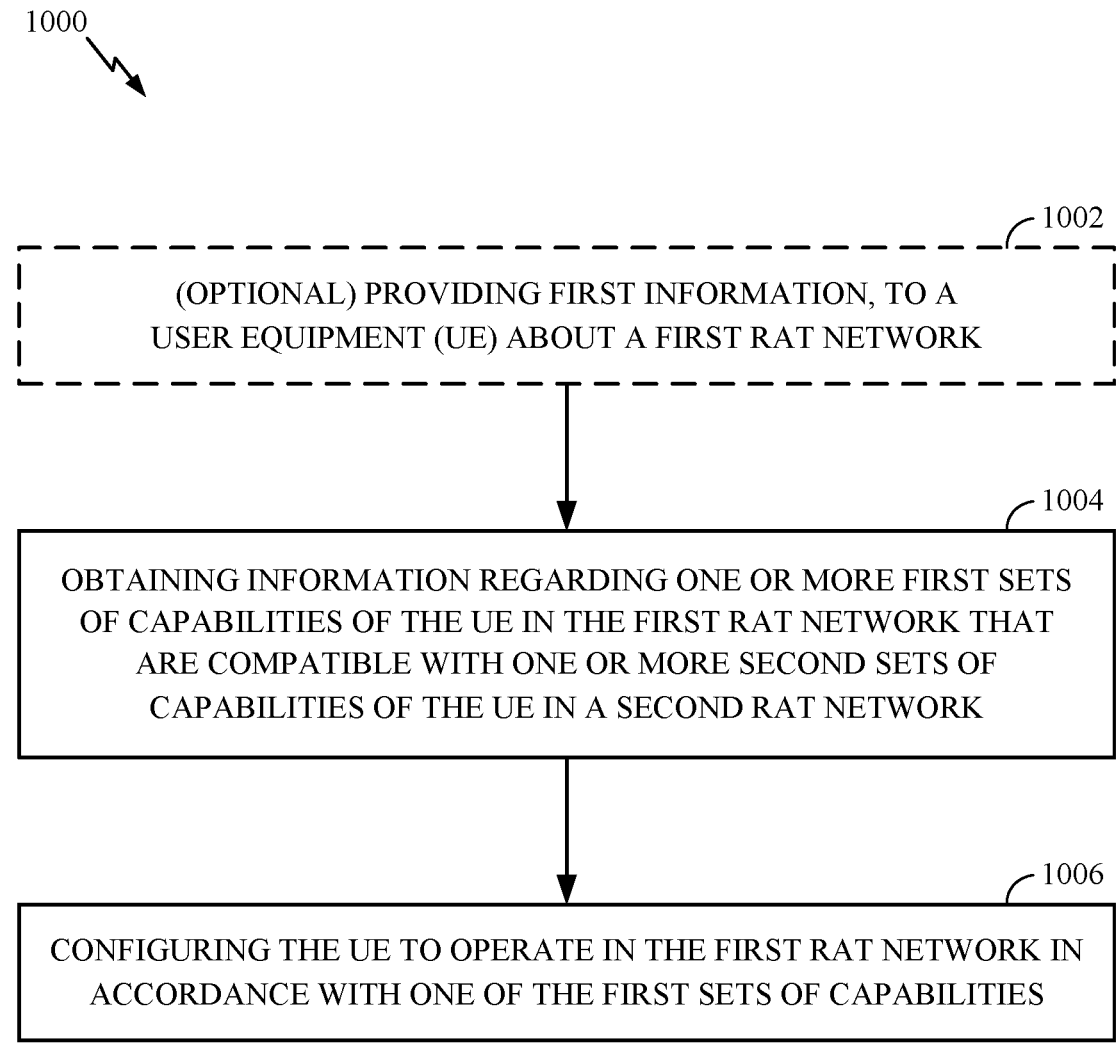
FIG. 10 illustrates example operations for wireless communications by a base station, such as a transmission reception points, in accordance with certain aspects of the present disclosure.

FIG. 10 illustrates example operations 1000 for coordinating capabilities across RATs by a base station (e.g., a TRP), in accordance with certain aspects of the present disclosure. For example, operations 1000 may be performed by a base station coordinating capabilities for a UE based on information provided by the UE while performing operations 900 described above. As will be described below, similar operations may be performed in first, second, and even third RATs to coordinate capabilities of a UE.

Operations 1000 being, at 1002, by obtaining information regarding one or more first sets of capabilities of a user equipment (UE) in the first RAT network that are compatible with one or more second sets of capabilities of the UE in one or more second RATs. At 1004, the base station configures the UE to operate in the first RAT network in accordance with one of the first sets of capabilities (based on the information obtained at 1002).

By implementing this type of capability coordination, aspects of the present disclosure may provide a RAN architecture that supports tight interworking between the new RAT (e.g., 5G NR) and a current RAT (e.g., LTE and/or WLAN). Considering high performing inter-RAT mobility and aggregation of data flows via at least dual connectivity between LTE and new RAT. This may be supported for both collocated and non-collocated site deployments.

As noted above, one possible source of expanding UE capability information is the number of band combinations supported by a UE. Certain aspects of the present disclosure may address this issue by adding a new container of band combinations, which may allow the network to provide a list of bands used in this network, to advertise the maximum number of carriers that are combined in the network, and/or to allow the UE to skip certain band combinations.

This approach may help support multi-RAT UEs, with an increased integration of air interfaces. For example, such UEs may support more LTE band combinations, then NR+LTE band combinations and NR+WLAN band combinations. Additionally, features such as MIMO, NAICS, Dual Connectivity, uplink carrier aggregation, number of CSI processes, may cause the number of combinations of capabilities to keep on growing. Combining different air interface carrier combinations will also create more combinations, and the size of the capabilities that a UE needs to communicate will keep increasing in combinatory manner.

In some cases, it may be desirable for one RAT to gather information about a UEs capabilities in another RAT. For example, NR may support the ability for the network to inquire for specific bands to be included in the UE capabilities, to inquire for another RAT's bands (e.g., 4G asking for 5G capabilities) the network's support of understanding skipped fall back combinations, and the network's ability to advertise the maximum number of carriers/bandwidth supported in this network on both the uplink and downlink.

Utilizing an LTE framework, a UE may need to report all-RAT capabilities to each (other) RAT, allowing the network to configure the UE appropriately for all RATs given particular inter-RAT dependencies. In some cases, NBs may have (semi-)static partitions between RATs or dynamically coordinate the configuration for the UE capability. NR deployment may take one or more formats with different RAT entities serving in different roles. For example, LTE may serve as a master of dual connectivity between LTE and NR, while NR may serve as a master of dual connectivity between LTE and NR, between WLAN and NR, in NR standalone, and/or may be other unforeseen deployments.

The techniques presented herein may allow a UE to expand the dual connectivity framework for LTE. For example, a UE may be able to signal, for every LTE band and/or band combination, which NR and/or which Wi-Fi bands, bandwidth classes, and/or bandwidths, can be configured simultaneously. In many cases, there may be more than one possibility for every LTE band combination. Starting without any carrier aggregation on LTE, and excluding RF restrictions, there may be a larger set of bands of Wifi and NR that can be activated in parallel. The set of bands that can be activated in parallel may decrease, however, with carrier aggregation (e.g., with 2×CA, 3×CA, or higher).

Certain information for band combinations may be defined in the NR capabilities information of a UE. Such information may include, for example, which LTE bands and band combinations, TMs, Timing Advance, simultaneous Rx-Tx, LTE DC, NAICS, supported CSI-Proc, MIMO, CA-BandwidthClass, and the like can be aggregated with every NR band (and eventually bandwidth or band combination, or other NR enhancements). It may also be defined in coordination, which WLAN bands can be associated with LTE and NR. In some cases, the UE LTE capabilities may have to be changed with every introduction of an NR band and band combination introduction. In some cases, to support the coordinated capability information, the Abstract syntax notation (ASN.1) may be updated. The UE NR capabilities may be changed with every introduction of an LTE band and band combination introduction and, in some cases, the LTE-NR backhaul may need to be updated frequently.

Thus, the management of multi-RAT UE capabilities, whether in LTE, NR and potentially in WLAN presents a challenge. Aspects of the present disclosure provide an alternative to signaling all information, by providing a coordinated approach that is scalable and may expand to meet future needs.

According to aspects presented herein, the UE may report a capability (or set of capabilities) per RAT. In some cases, the UE may not report its capabilities of RAT to the other RAT network unless requested by the host network. For example, if requested (e.g., by an LTE network), the UE may report its NR capabilities to the LTE network by either adding them or encapsulating them in the LTE capabilities, or by sending them in a separate message. Similarly, if requested by an NR network, the UE may report its LTE capabilities to the NR network by either adding them or encapsulating them in the NR capabilities, or by sending them in a separate message. In some cases, the UE may be able to report its NR measurement capabilities to the LTE network, and may be able to report its LTE measurement capabilities to the NR network. There may be multiple networks of the same type (example multiple 5G networks), with different requested bands and configurations. The request may include a network identifier (such as a PLMN ID). The UE should be able to manage multiple capabilities belonging to different sets for the same technology.

Figure 11:
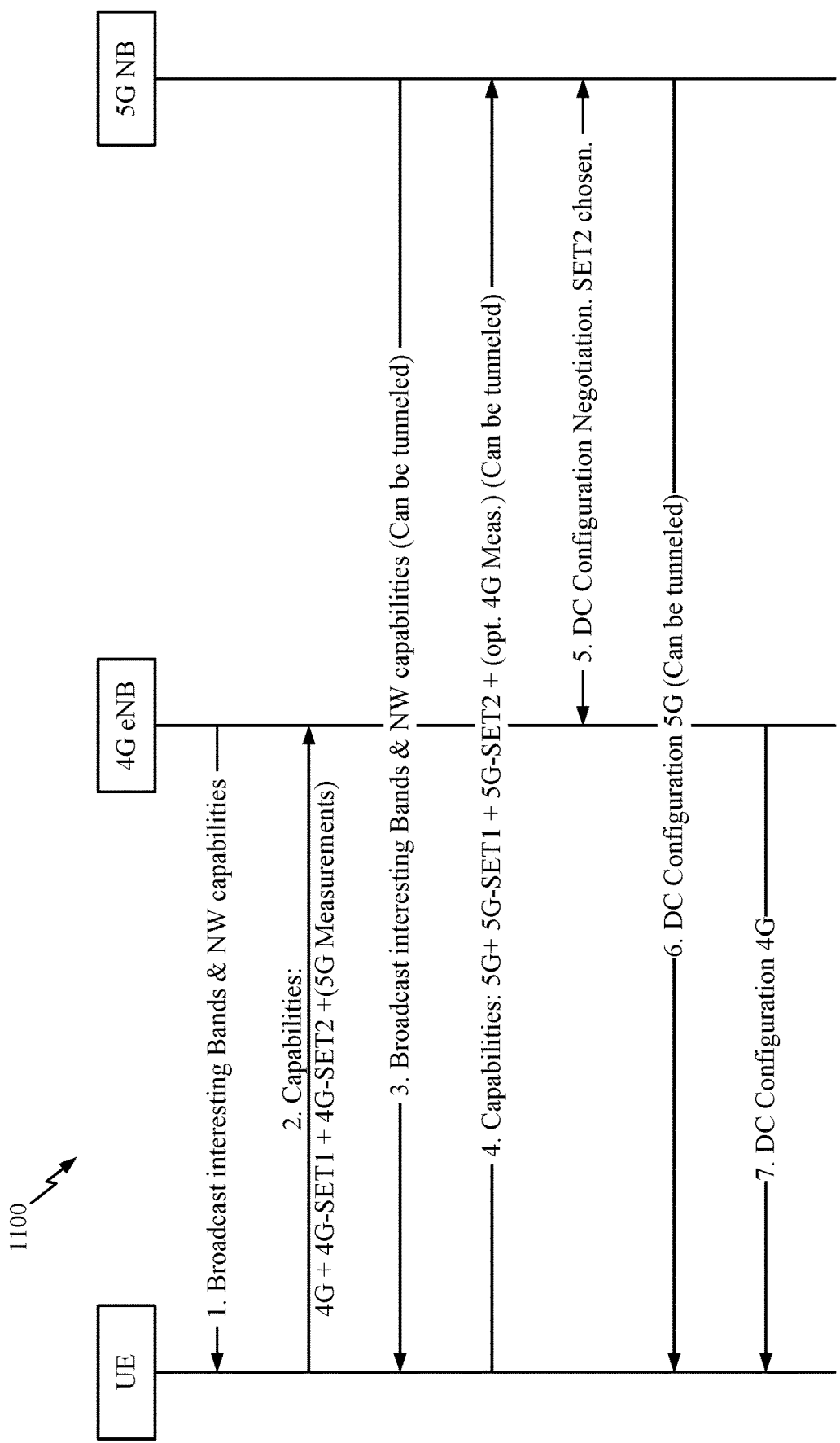
FIGS. 11-14 illustrate example call flow diagrams for coordinating inter-RAT capabilities, in accordance with certain aspects of the present disclosure.

FIG. 11 illustrates an example call flow 1100 for coordinating capability information, in accordance with certain aspects of the present disclosure. As illustrated, a 4G eNB may broadcast available (interesting) bands (or bands of interest) and LTE network capabilities (at step 1). At step 2, the UE provides sets of LTE capabilities (and possibly 5G measurements) to the eNB. At step 3, a 5G NB may broadcast available (interesting) bands and NR network capabilities. At step 4, the UE provides sets of NR capabilities (and possibly 4G measurements) to the NR NB (possibly by tunneling via the LTE network). As illustrated, at step 5, the LTE and NR networks may communicate (e.g., via backhaul) to determine a static (or semi-static) configuration for both 5G (step 6) and 4G (step 7).

Figure 12:
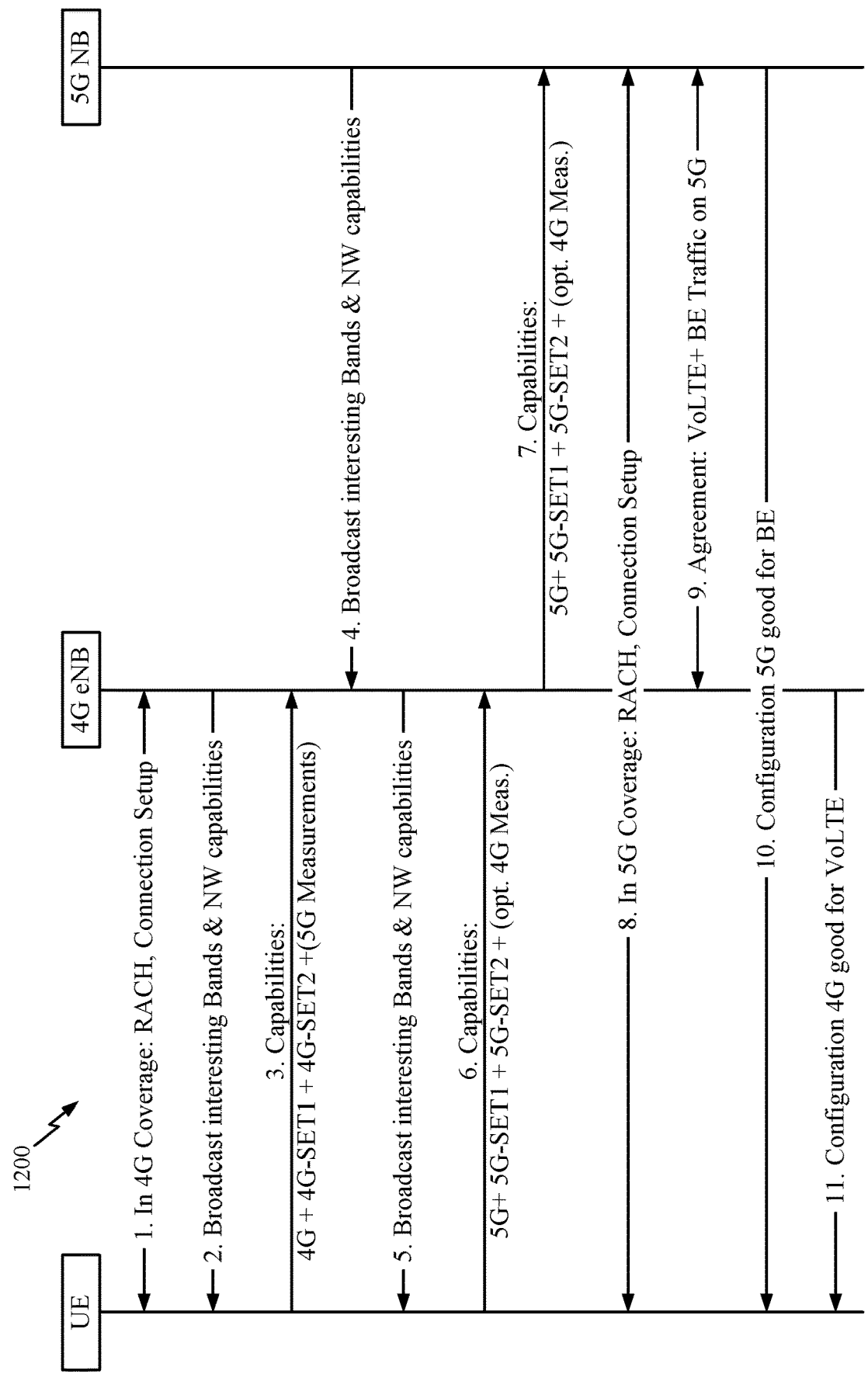

FIG. 12 illustrates another example call flow utilizing tunneling and split bearers (each bearer on a RAT). As illustrated, in this example, NR (interesting) bands and NR network capabilities may be provided by tunneling via the LTE network (at steps 4 and 5). Similarly, the UE provides sets of NR capabilities (and possibly 4G measurements) to the NR NB by tunneling via the LTE network (at steps 6 and 7). In the illustrated example, for example, based on the measurements provided, the UE may perform a connection setup with NR (step 8). Based on an agreement between LTE and NR for a particular type of traffic, such as Voice over LTE (VoLTE) Best Effort (BE) traffic (step 9), the UE may be configured for NR (at step 10) and LTE (at step 11).

Figure 13:
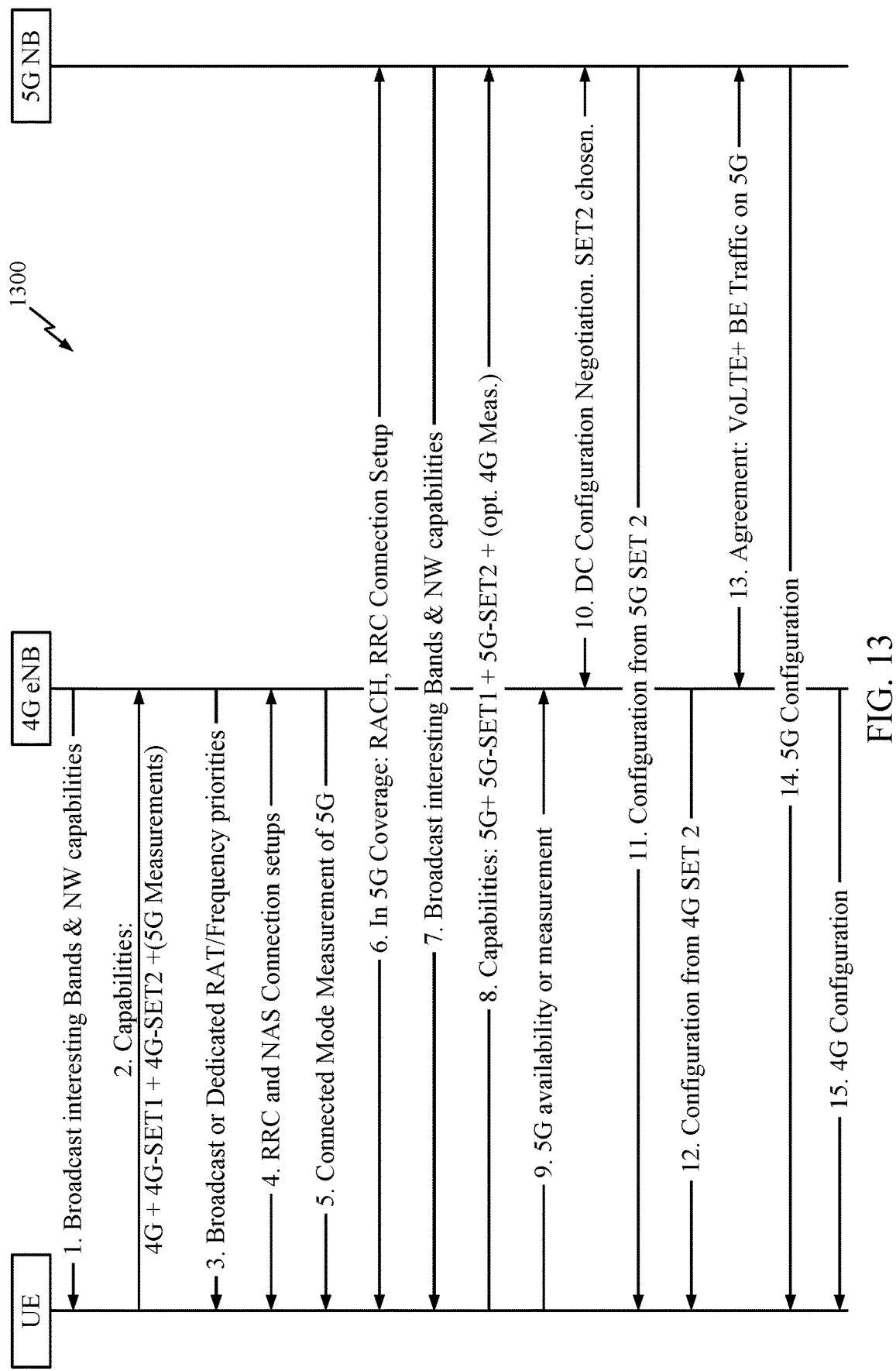

FIG. 13 illustrates an example call flow with an inter-RAT measurement example for the UE. As compared to FIG. 11, in this example, additional information may be provided to the UE, such as broadcast or dedicated RAT/frequency priorities (at step 3) and the UE may perform RRC and/or NAS setup (at step 4) and the UE may be configured for 5G measurement (at step 5). After connecting to the 5G network (at step 6), the UE may provide sets of 5G capabilities in the NR network (at step 8) and may provide availability of NR measurements to the LTE network (at step 9). Based on a negotiation between LTE and NR (step 10), the UE may be configured (at step 11) for NR using one of the NR capability sets (SET2) provided and the UE may be configured (at step 12) for LTE using one of the LTE capability sets (SET2) provided.

Using the sets of configurations, the LTE and NR networks may update the UE configuration on occasion. For example, based on an agreement between LTE and NR for a particular type of traffic, such as VoLTE Best Effort traffic (step 13), the UE may be configured for a different NR capability set (at step 14) and a different LTE capability set (at step 15).

Figure 14:
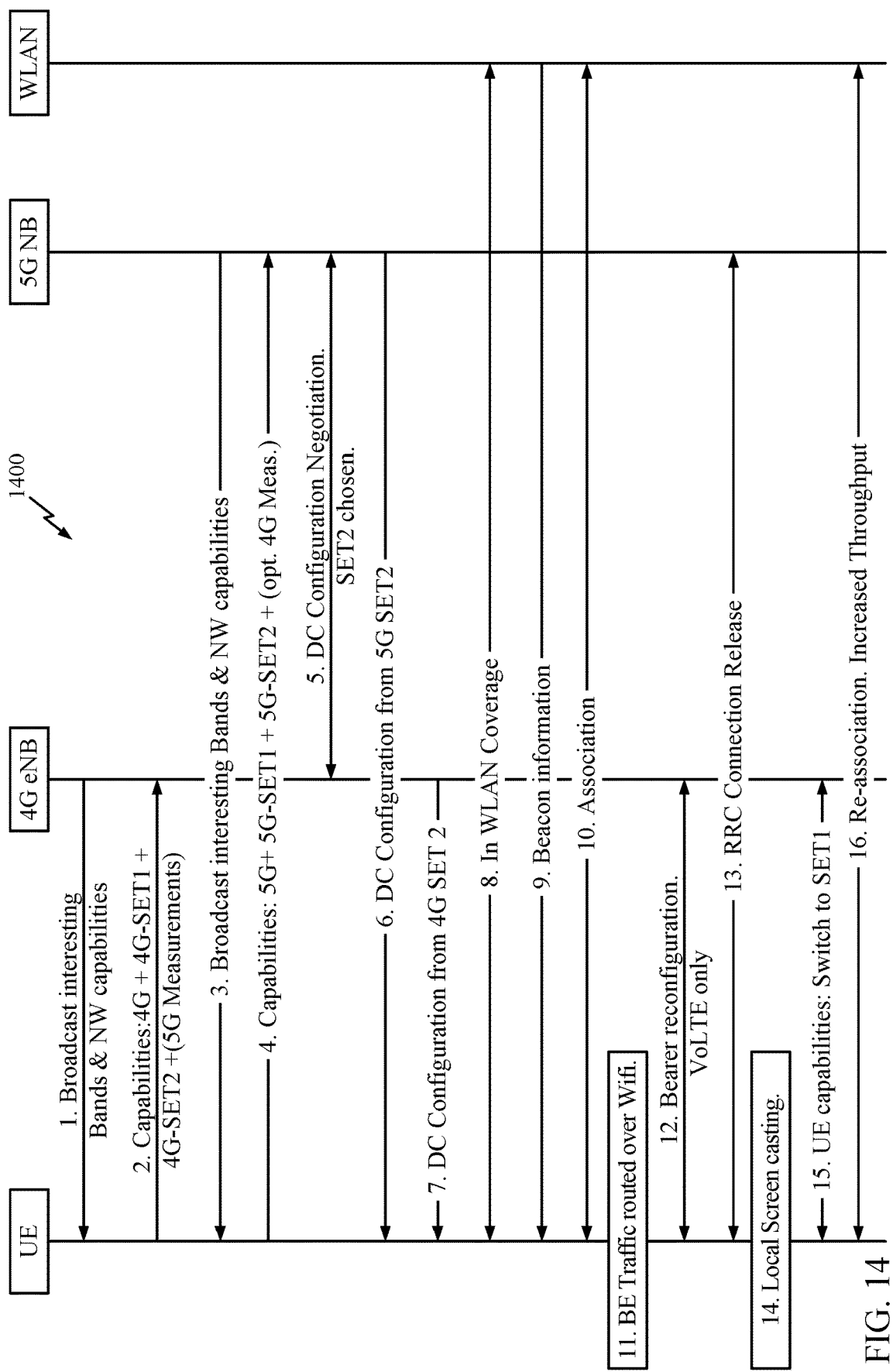

FIG. 14 illustrates an example call flow with negotiation between more than two RATs. In this example, the UE capability is coordinated between LTE, NR, and a WLAN network. As illustrated, the steps to coordinate with LTE and NR may be similar to those described above with reference to FIG. 11. Additionally, however, when the UE enters WLAN coverage (at step 8), the UE may detect a WLAN beacon (at step 9) and perform association with the WLAN network (at step 10). The UE may then decide (at step 11) to route best effort (BE) traffic over the WLAN network. In this case, a bearer reconfiguration may occur (at step 12) and the NR RRC connection may be released (at step 13). The UE may then be switched to a new capability set (at step 15) and may perform re-association with the WLAN network (at step 16) to increase throughput.

In some cases, in addition to tunneling information, information may be conveyed via a split signaling radio bearer (SRB) scenario. In general, a split SRB means that a RAN establishes a signaling radio bearer (SRB) at the base station/Node-B of each RAT and signaling for the first RAT can be delivered over either the first RAT SRB or the second RAT SRB.

In some cases, offloading traffic by different RATs may require full capabilities on the selected system, whether a WWAN or WLAN. So, depending on how the traffic is directed by the network, the resource allocation in the UE may follow. To enable that, aspects of the present disclosure propose that the UE capabilities may be subdivided in sets per RAT. In some cases, there may be an implicit association between all set "A"s in each RAT, which means that the UE can support any configuration belonging to any of the set A's simultaneously. In other words, each RAT may pick one configuration from its set A, and all corresponding RAT configurations are valid simultaneous configurations. In some cases, there may also be an explicit association between a set in one RAT, with a set or list of sets in another RAT. In such cases, once two RATs agree on a set, then, each RAT may be free to choose any capability within that set. In some cases, if there is no coordination between RATs, then, the UE may be able to inform the network of the set being used by the other RATs, or alternatively, the UE may be able to re-negotiate its capabilities dynamically.

In some cases, UEs may have occasion to update their capabilities (e.g., to provide different services). For example, UEs may act as WLAN Access Points, and may need to repartition hardware resources to do so. In such cases, a UE may end up having to under-report capabilities, for example, because it is not able or allowed to support some WWAN concurrencies (even if such concurrencies may not likely happen in reality).

In some cases, the UE may associate with WLAN APs of different capabilities for extended periods of time. There is a large number of legacy WLAN deployments that support older WLAN standards. The UE may share resources between WWAN and WLAN, and as a result, what resources are available to WWAN could be increased for an extended period of time, for example, when the WLAN load is smaller. In an extreme case, the UE may not be even associated with a WLAN AP, and some resources can be fully dedicated to WWAN.

In some cases, UE cost can be reduced by sharing resources between different air interfaces. Local UE conditions and considerations, unknown to the network, result in the UE needing to update its UE capabilities occasionally. The UE capability updates may need not be as frequent as in 3G (every RRC connection). In some cases, however, the UE may be able to initiate an NR capabilities update. The rate of updates may be limited in a standard. For example, a UE may be able to initiate an LTE capabilities update, but the rate of updates may be limited in the standard.

As described herein, NR may support the ability of the network to inquire for specific bands to be included in the UE capabilities, the ability of the network to support the understanding skipped fall back combinations, and the ability of the network to advertise the maximum number of carriers/bandwidth supported in this network (e.g., on both the uplink and downlink). As noted above, the UE may report a capability per RAT. In some cases, the UE may not report its NR capabilities to the LTE network, nor report its LTE capabilities to the NR network. However, the UE may be able to report its NR measurement capabilities to the LTE network and, similarly, may be able to report its LTE measurement capabilities to the NR network.

As noted above, moving forward, devices and infrastructure will likely need to support increased inter-RAT dependency, which presents design challenges. One approach is to try and limit RAT dependency within the standards and at the base station level (e.g., at the LTE eNB and 5G "gNB" level).

In some cases, a UE may report a separate capabilities (e.g., to operate on various bands) per RAT. Given a requirement to support separate capabilities on NR and LTE networks, another challenge is how to handle inter-RAT dependencies, such as band combinations (e.g., which combinations of an LTE band and an NR band can be supported).

One way to understand such inter-RAT dependencies is to consider the LTE and NR band combinations as a matrix. For example, LTE band support may represent the rows of the matrix while NR band support represents the columns. In other words, each row of the matrix may correspond to a group (or set) of LTE bands and band combinations, while each column may correspond to a group (or set) of NR bands and band combinations.

The UE can then populate the entries of the matrix, for example, such that a 1 represents a band combination is supported and a zero represents that it is not supported. In this manner, interdependency between LTE and NR can be represented by a dependency matrix. However, as the number of band combinations grow, this matrix (and number of bits) may grow correspondingly large, increasing signaling overhead.

Aspects of the present disclosure, however, provide a simplified approach that might limit the matrix size. This simplification may be achievable by recognizing the bulk of most user traffic typically takes one of the following routes: HSPA, LTE or WLAN. Extending this to NR, in the future, the bulk of the traffic will likely be on NR, WLAN or LTE and it is anticipated that the secondary RAT will be primarily be used for control or specialized services.

As a result, not every combination of possible use cases needs to be supported for inter-RAT use cases, so the dependency matrix can be simplified. So, depending on how the traffic is directed by the network, the resource allocation in the UE follows accordingly. To enable this, aspects of the present disclosure propose to describe the dependency matrix based on groups where, within each RAT, the UE capabilities are subdivided within the groups.

In other words, the UE capabilities may be subdivided in groups per RAT, of which only a few are needed to define typical behaviors. FIGS. 15A-15C illustrate a table showing how LTE band combinations could be divided by groups (groups 1-11 in the example), where L/M/H correspond to bands in low, medium or high frequencies.

It may be noted that it is not necessary to index every entry in the band combinations. In other words, it may just necessary to index when the group changes. Thus, various rules could be implemented that restrict some of the band combination listings.

Assuming 11 possible groups (as represented by the columns shown in FIG. 16), an LTE UE may only need to add around 11 groups of 16 bits each (for a total of 176 bits). Even assuming two bits per band combination, that only adds ~224 bits, for a total of 400 bits. Even if that is increased to 32 groups, that would add around 576 bits (11×16+224). Thus, this is likely a much smaller signaling impact than the alternative approach of including for every band combination the NR capabilities.

FIG. 16 illustrates one example of a dependency matrix for LTE and NR group combinations. The information in the example matrix shown in FIG. 16 may be interpreted as follows. Assuming an X in the matrix indicates support, while operating in a first low band in LTE, the UE can support medium and high NR bands 1, 3, 4, and 6, as well as mmWave bands 7 and 8. For a second LTE band, however, the UE can only support medium NR band 1, high NR band 2, and mmWave band 7. For a first Mid LTE band 3, the UE can only support high NR bands 4 and 6, as well as both mmWave bands 7 and 8. For a second Mid LTE band, the UE can only support high NR band 4 and mmWave band 7. For a first high LTE band 5, the UE can support both NR medium bands 1 and 3, as well as mmWave bands 7 and 8. For a second high LTE band 6, however, the UE can only support high NR band 4 and mmWave band 7.

Of course, the particular number of bands supported in each RAT may vary. For example, FIG. 17 illustrates an example, where 3 medium NR bands (1-3) and 3 high NR bands (4-6) are supported. In this example, only 2 bits per row are needed to support these extra bands.

The dependency matrix may be used as follows. Based on UE capabilities (e.g., as reported by the UE), the primary RAT may determine how to use the capabilities of the UE to configure it for service. In other words, the primary RAT may determine which group to configure the UE for based on the configuration. Note that this is even useful within a RAT for expressing capabilities.

The primary RAT may then indicate the group, for example, as the row or column of the dependency matrix it is using when it is trying to coordinate capabilities. The secondary RAT may then look at the corresponding entries in the dependency matrix for that RAT.

As an example, assuming LTE is the primary RAT, an eNB may select a group and signal the corresponding row (e.g., per FIG. 16). Assuming NR is a secondary RAT, a NR base station (e.g., gNB) may then select a corresponding entry in the dependency matrix for that group.

In this manner, a primary RAT may determine UE capabilities based on a mapping between first sets of capabilities of the UE in the first RAT network and second sets of capabilities of the UE in the second RAT network (e.g., provided by a matrix). As described above, the mapping may be provided in the capabilities to a first RAT, a second RAT or both. The mapping may be fixed (e.g., the n-th set of capabilities of the UE in the first RAT network may compatible with the n-th set of capabilities of the UE in the second RAT). In this manner, a mapping may indicate a set of capabilities is reserved for exclusive operation on a particular RAT.

As presented herein, given UE capabilities, a primary RAT may pick a minimum configuration that satisfying certain requirements and may signal this configuration to the secondary RAT. An LTE eNB, if LTE is the primary RAT, may signal a row to NR eNB, if a secondary RAT. The NR gNB may then select a configuration (column entry) that is compatible with that LTE group/row. Similarly, a NR gNB, if NR is the primary RAT, may signal a column to an LTE eNB, if a secondary RAT. The LTE eNB may then select a configuration (row entry) that is compatible with that NR group/column.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

Moreover, the term "or" is intended to mean an inclusive "or" rather than an exclusive "or." That is, unless specified otherwise, or clear from the context, the phrase, for example, "X employs A or B" is intended to mean any of the natural inclusive permutations. That is, for example the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form. A phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language of claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. A method of wireless communication by a user equipment (UE), comprising:

receiving first information about a first radio access technology (RAT) network, wherein the first information comprises network capability information for the first RAT network;

receiving, from a base station of a second RAT network, second information about the second RAT network, wherein the second information comprises network capability information for the second RAT network;

determining, based on the first information and second information, one or more first sets of capabilities of the UE in the first RAT network that are compatible with one or more second sets of capabilities of the UE in the second RAT;

providing a first indication of one or more of the first sets of capabilities to the first RAT network;

providing a second indication of one or more of the second sets of capabilities to the second RAT network; and receiving signaling configuring the UE to operate in the first RAT network in accordance with one of the indicated first sets of capabilities and to operate in the second RAT network in accordance with one of the indicated second sets of capabilities.

2. The method of claim 1, further comprising:
receiving third information about a third RAT network; and providing, to the third RAT, a third indication of one or more third sets of capabilities of the UE in the third RAT network that are compatible with the first and second sets of capabilities of the UE.

3. The method of claim 1, further comprising:
receiving, from the first RAT network, a request for the second sets of capabilities of the UE in the second RAT network; and providing an indication of the second sets of capabilities in response to the request.

4. The method of claim 1, wherein at least one of the first information or the second information further comprises:
information regarding one or more bands of interest.

5. The method of claim 1, wherein the first information is received from a base station in the second RAT network.

6. The method of claim 1, wherein the determining is based on a mapping between the one or more first sets of capabilities of the UE in the first RAT network and the one or more second sets of capabilities of the UE in the second RAT network.

7. The method of claim 6, wherein the mapping is provided to the first RAT, to the second RAT or to both the first and second RAT networks.

8. The method of claim 1, further comprising signaling an update in the one or more first sets of capabilities of the UE in at least one of:
the first RAT network; or
the second RAT network.

9. A method of wireless communication by a base station of a first radio access technology (RAT) network, comprising:
obtaining information regarding one or more first sets of capabilities of a user equipment (UE) in the first RAT network that are compatible with one or more second sets of capabilities of the UE in one or more second RAT networks, wherein the one or more first sets of capabilities is based on first information about the first RAT network and the one or more second sets of capabilities is based on second information about the second RAT network, wherein the first information comprises network capability information for the first RAT and the second information comprises network capability information for the second RAT;

maintaining a matrix, wherein:
each row of the matrix corresponds to one of the first sets of UE capabilities; and
each column of the matrix corresponds to one of the second sets of UE capabilities; or
each column of the matrix corresponds to one of the first sets of UE capabilities; and
each row of the matrix corresponds to one of the second sets of UE capabilities; and configuring the UE to operate in the first RAT network in accordance with one of the first sets of capabilities.

10. The method of claim 9, further comprising:
sending the UE a request for the second set of capabilities of the UE in the second RAT network; and
receiving an indication of the second sets of capabilities in response to the request.

11. The method of claim 9, further comprising:
providing the first information, to a user equipment;
wherein the first information further comprises:
information regarding one or more bands of interest.

12. The method of claim 11, wherein the first information about the first RAT network is provided to the UE via tunneling through the second RAT network.

13. The method of claim 11, wherein the first information about the first RAT network is provided via a split signal radio bearer (SRB) signaling.

14. The method of claim 9, further comprising:
selecting the first set of capabilities based on a mapping between first sets of capabilities of the UE in the first RAT network and the second sets of capabilities of the UE in the second RAT network.

15. The method of claim 9, wherein obtaining the information regarding the one or more first sets of capabilities in the first RAT network, comprises:
obtaining an indication of the first sets of capabilities from the second RAT network via tunneling.

16. The method of claim 9, further comprising receiving signaling of:
an update in the one or more first sets of capabilities of the UE in the first RAT network.

17. The method of claim 9, further comprising:
communicating with the second RAT network to negotiate which of the first sets of UE capabilities to configure the UE for.

18. The method of claim 9, further comprising:
communicating with the UE to negotiate which of the first sets of UE capabilities to configure the UE for.

19. The method of claim 9, further comprising:
configuring the UE according to one of the first sets of UE capabilities; and
providing an indication of a corresponding row in the matrix to the second RAT network.

20. The method of claim 9, further comprising:
receiving an indication, from the second RAT, of a column in the matrix; and
wherein the UE is configured to operate in the first RAT network based on a row entry in the matrix for the indicated column.

21. The method of claim 9, further comprising:
configuring the UE according to one of the first sets of UE capabilities; and
providing an indication of a corresponding column in the matrix to the second RAT network.

22. The method of claim 9, further comprising:
receiving an indication, from the second RAT, of a column in the matrix; and
wherein the UE is configured to operate in the first RAT network based on a row entry in the matrix for the indicated column.

23. An apparatus for wireless communications, comprising:

means for receiving first information about a first radio access technology (RAT) network, wherein the first information comprises network capability information for the first RAT network;

means for receiving, from a base station of a second RAT network, second information about the second RAT network, wherein the second information comprises network capability information for the second RAT network;

means for determining, based on the first information and second information, one or more first sets of capabilities of a user equipment (UE) in the first RAT network that are compatible with one or more second sets of capabilities of the UE in the second RAT;

means for providing a first indication of one or more of the first sets of capabilities to the first RAT network;

means for providing a second indication of one or more of the second sets of capabilities to the second RAT network; and means for receiving signaling configuring the UE to operate in the first RAT network in accordance with one of the indicated first sets of capabilities and to operate in the second RAT network in accordance with one of the indicated second sets of capabilities.

24. An apparatus for wireless communications, comprising:

means for obtaining information regarding one or more first sets of capabilities of a user equipment (UE) in a first radio access technology (RAT) network that are compatible with one or more second sets of capabilities of the UE in one or more second RAT networks, wherein the one or more first sets of capabilities is based on first information about the first RAT network and the one or more second sets of capabilities is based on second information about the second RAT network, wherein the first information comprises network capability information for the first RAT and the second information comprises network capability information for the second RAT;

means for maintaining a matrix, wherein:
 each row of the matrix corresponds to one of the first sets of UE capabilities; and
 each column of the matrix corresponds to one of the second sets of UE capabilities; or
 each column of the matrix corresponds to one of the first sets of UE capabilities; and
 each row of the matrix corresponds to one of the second sets of UE capabilities; and means for configuring the UE to operate in the first RAT network in accordance with one of the first sets of capabilities.

25. A non-transitory computer-readable medium, comprising:

instructions that, when executed by at least one processor, cause the at least one processor to:

receive first information about a first radio access technology (RAT) network, wherein the first information comprises network capability information for the first RAT network;

receive, from a base station of a second RAT network, second information about the second RAT network, wherein the second information comprises network capability information for the second RAT network;

determine, based on the first information and second information, one or more first sets of capabilities of the UE in the first RAT network that are compatible with one or more second sets of capabilities of the UE in the second RAT;

provide a first indication of one or more of the first sets of capabilities to the first RAT network;

provide a second indication of one or more of the second sets of capabilities to the second RAT network; and receive signaling configuring the UE to operate in the first RAT network in accordance with one of the indicated first sets of capabilities and to operate in the second RAT network in accordance with one of the indicated second sets of capabilities.

26. A non-transitory computer-readable medium, comprising:

instructions that, when executed by at least one processor, cause the at least one processor to:

obtain information regarding one or more first sets of capabilities of a user equipment (UE) in a first radio access technology (RAT) network that are compatible with one or more second sets of capabilities of the UE in one or more second RAT networks, wherein the one or more first sets of capabilities is based on first information about the first RAT network and the one or more second sets of capabilities is based on second information about the second RAT network, wherein the first information comprises network capability information for the first RAT and the second information comprises network capability information for the second RAT;

maintain a matrix, wherein:
 each row of the matrix corresponds to one of the first sets of UE capabilities; and
 each column of the matrix corresponds to one of the second sets of UE capabilities; or
 each column of the matrix corresponds to one of the first sets of UE capabilities; and
 each row of the matrix corresponds to one of the second sets of UE capabilities; and configure the UE to operate in the first RAT network in accordance with one of the first sets of capabilities.

27. A user equipment (UE), comprising:

at least one processor configured to:

receive first information about a first radio access technology (RAT) network, wherein the first information comprises network capability information for the first RAT network;

receive, from a base station of a second RAT network, second information about the second RAT network, wherein the second information comprises network capability information for the second RAT network;

determine, based on the first information and second information, one or more first sets of capabilities of the UE in the first RAT network that are compatible with one or more second sets of capabilities of the UE in the second RAT;

provide a first indication of one or more of the first sets of capabilities to the first RAT network; and provide a second indication of one or more of the second sets of capabilities to the second RAT network; and a receiver configured to receive signaling configuring the UE to operate in the first RAT network in accordance with one of the indicated first sets of capabilities and to operate in the second RAT network in accordance with one of the indicated second sets of capabilities.

28. A base station of a first radio access technology (RAT) network, comprising:

at least one processor configured to:
- obtain information regarding one or more first sets of capabilities of a user equipment (UE) in the first RAT network that are compatible with one or more second sets of capabilities of the UE in one or more second RAT networks, wherein the one or more first sets of capabilities is based on first information about the first RAT network and the one or more second sets of capabilities is based on second information about the second RAT network, wherein the first information comprises network capability information for the first RAT and the second information comprises network capability information for the second RAT; and
- maintain a matrix, wherein:
  - each row of the matrix corresponds to one of the first sets of UE capabilities; and
  - each column of the matrix corresponds to one of the second sets of UE capabilities; or
  - each column of the matrix corresponds to one of the first sets of UE capabilities; and
  - each row of the matrix corresponds to one of the second sets of UE capabilities; and a transmitter configured to output signaling to configure the UE to operate in the first RAT network in accordance with one of the first sets of capabilities.

* * * * *